(12) United States Patent
Sumioka

(10) Patent No.: US 11,183,950 B2
(45) Date of Patent: Nov. 23, 2021

(54) CONTROL APPARATUS FOR VIBRATORY ACTUATOR, DRIVING APPARATUS, IMAGING APPARATUS, AND METHOD FOR CONTROLLING VIBRATORY ACTUATOR

(71) Applicant: CANON KABUSHIKI KAISHA, Tokyo (JP)

(72) Inventor: Jun Sumioka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 869 days.

(21) Appl. No.: 15/947,585

(22) Filed: Apr. 6, 2018

(65) Prior Publication Data
US 2018/0331634 A1 Nov. 15, 2018

(30) Foreign Application Priority Data
May 11, 2017 (JP) .............................. JP2017-094995

(51) Int. Cl.
| | |
|---|---|
| *H02N 2/00* | (2006.01) |
| *H01L 41/04* | (2006.01) |
| *H01L 41/09* | (2006.01) |
| *H02N 2/10* | (2006.01) |
| *H02N 2/14* | (2006.01) |
| *G03B 19/12* | (2021.01) |
| *G02B 7/182* | (2021.01) |

(52) U.S. Cl.
CPC ............. *H02N 2/008* (2013.01); *G03B 19/12* (2013.01); *H01L 41/042* (2013.01); *H01L 41/09* (2013.01); *H02N 2/001* (2013.01); *H02N 2/106* (2013.01); *H02N 2/142* (2013.01); *G02B 7/182* (2013.01); *G03B 2205/0053* (2013.01)

(58) Field of Classification Search
CPC ...... H02N 2/008; H02N 2/001; H01L 41/042; H01L 41/09
See application file for complete search history.

(56) References Cited

U.S. PATENT DOCUMENTS

| | | | |
|---|---|---|---|
| 2005/0140249 A1* | 6/2005 | Kita ..................... | H01L 41/094 310/359 |
| 2008/0048522 A1* | 2/2008 | Tanaka .................. | H02N 2/008 310/317 |

(Continued)

FOREIGN PATENT DOCUMENTS

| | | |
|---|---|---|
| JP | 5-211785 A | 8/1993 |
| JP | 2002014272 A | 1/2002 |

*Primary Examiner* — Bryan P Gordon
(74) *Attorney, Agent, or Firm* — Canon U.S.A., Inc. I.P. Division

(57) ABSTRACT

A control apparatus controls driving a vibratory actuator. The control apparatus applies a signal to an electromechanical energy conversion device of a vibrator of the vibratory actuator to excite vibration on the vibrator and cause the vibrator and a driven object contacting the vibrator to move relative to one another by the vibration. If the vibratory actuator decelerates, the control apparatus changes a driving frequency of the signal to a frequency higher than a start-up frequency of the vibratory actuator and a preceding frequency at a deceleration start position. After changing the driving frequency of the signal, the control apparatus controls the signal driving frequency to perform deceleration control and fixes voltage of the signal in a deceleration period in which the vibratory actuator is decelerated.

26 Claims, 13 Drawing Sheets

(56) References Cited

U.S. PATENT DOCUMENTS

| | | | |
|---|---|---|---|
| 2009/0167798 A1* | 7/2009 | Ide | B41J 2/04596 347/10 |
| 2010/0213882 A1* | 8/2010 | Adachi | H02N 2/026 318/116 |
| 2013/0249445 A1* | 9/2013 | Sumioka | H02N 2/103 318/116 |
| 2017/0279380 A1* | 9/2017 | Atsuta | H02N 2/142 |
| 2018/0117642 A1* | 5/2018 | Magee | G01H 1/00 |

* cited by examiner

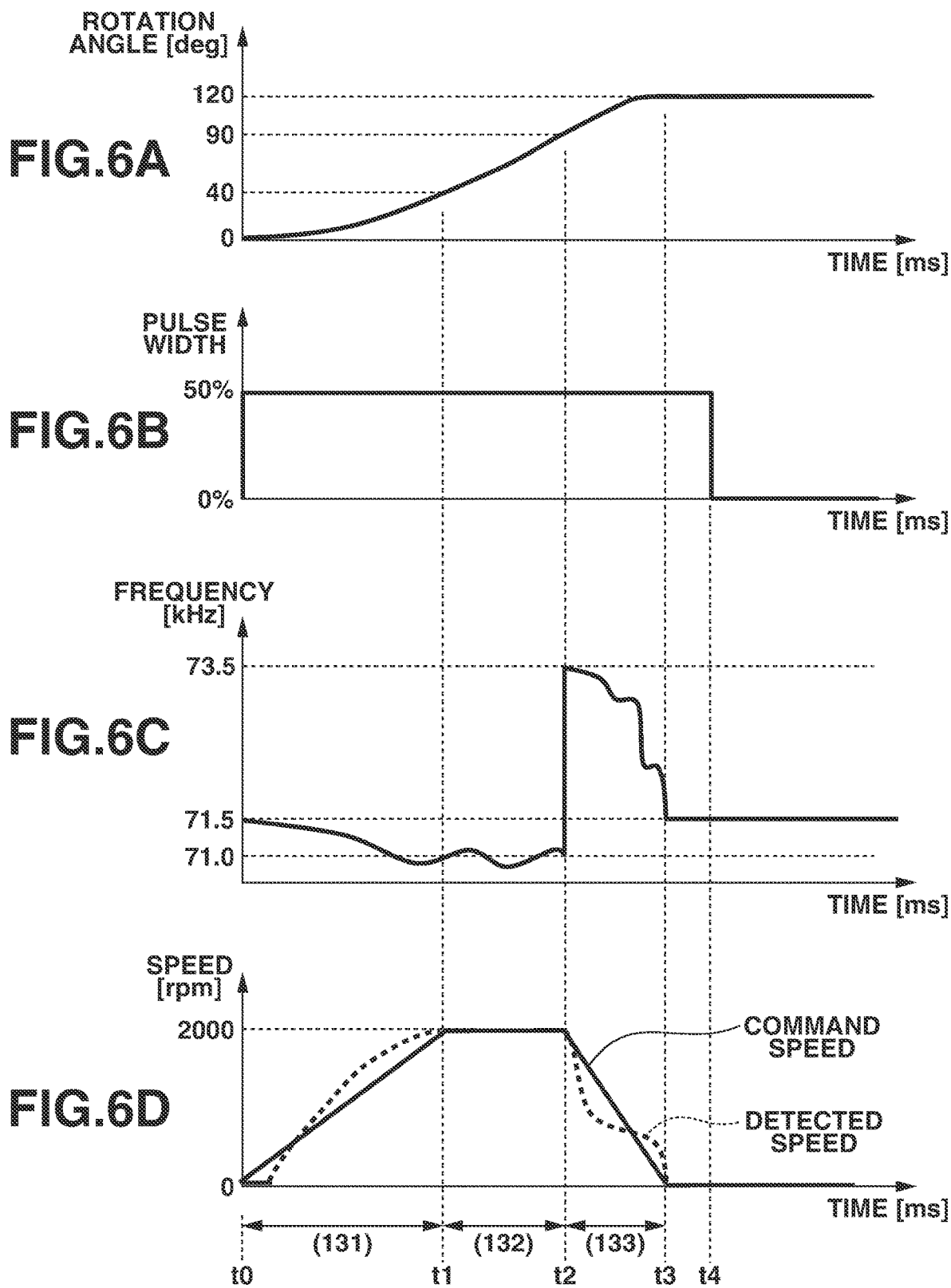

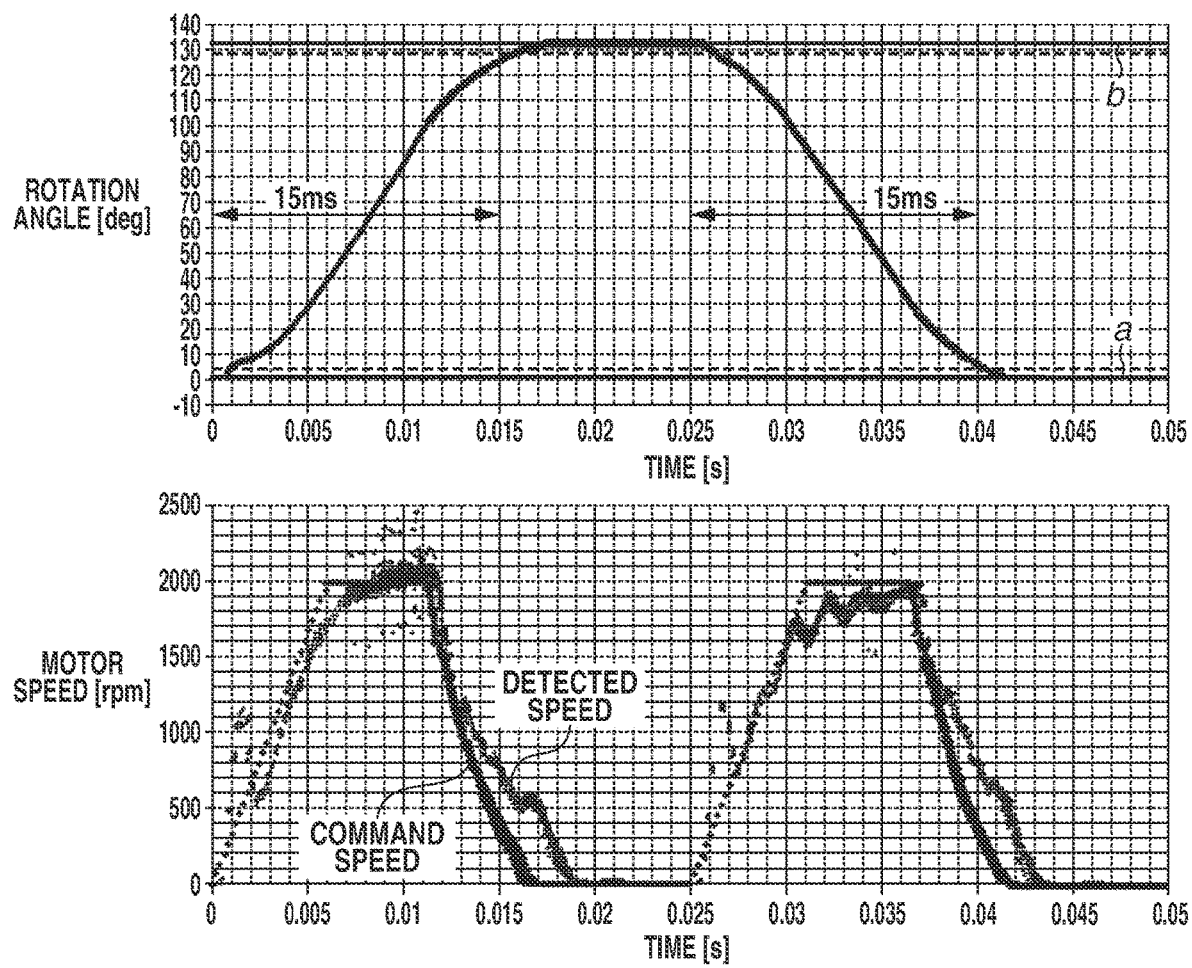

CONTROL APPARATUS FOR VIBRATORY ACTUATOR, DRIVING APPARATUS, IMAGING APPARATUS, AND METHOD FOR CONTROLLING VIBRATORY ACTUATOR

BACKGROUND OF THE INVENTION

Field of the Invention

The present disclosure relates to a control apparatus for a vibratory actuator, a driving apparatus using the control apparatus, an imaging apparatus using the control apparatus, and a method for controlling a vibratory actuator.

Description of the Related Art

As a non-electromagnetic actuator, a vibratory actuator is known, in which a vibrator and a driven body are brought into pressure contact with each other, and the vibrator and the driven body are relatively moved by vibration excited in the vibrator. The vibrator includes, for example, an elastic body and an electromechanical energy conversion device such as a piezoelectric device that is coupled to the elastic body. In the vibratory actuator, a driving voltage is applied to the electromechanical energy conversion device to generate high-frequency vibration on the vibrator, and generated vibration energy is extracted as mechanical motion that is relative movement of the vibrator and the driven body.

In a case where a driven object is accelerated or decelerated at high speed by the vibratory actuator, the driven object may need to stop at a sought position with high accuracy in some cases.

Japanese Patent Application Laid-Open No. 2002-14272 discusses two control types of high-speed feed control and positioning control that are switched while performing feedback control of the vibratory actuator, to refine positioning accuracy of the driven object. More specifically, according to Japanese Patent Application Laid-Open No. 2002-14272, the driven object is moved toward a target position through the high-speed feed control, and when the driven object reaches the vicinity of the target position, a frequency of an oscillator is selectively changed to decelerate and position the driven object through voltage control. As a result, positioning control which is more precise than the high-speed feed control is performed in the vicinity of the target position. Thus, stopping accuracy of the driven object can be refined.

In the control discussed in Japanese Patent Application Laid-Open No. 2002-14272, however, a state of a frictional contact portion may be drastically changed between the vibrator and the driven body, which causes speed fluctuation. As a result, the speed of the vibratory actuator may vary by a large amount at the time of deceleration, and speed variation in deceleration may become unstable. Therefore, there is a danger that the driving may be stopped before the driven object reaches the target position, or may not sufficiently decelerate at the target position. Accordingly, for example, the driven object may collide with a contact member disposed at the target position with force, and the driven object may return back in a direction opposite to the moving direction, and stop at a position different from the target. Thus, sufficient stopping accuracy may not be achieved by the conventional method.

SUMMARY OF THE INVENTION

The present disclosure is directed to a controlling apparatus for a vibratory actuator that reduces speed change in the case of controlling deceleration, as compared with a conventional control apparatus.

According to an aspect of the present invention, a control apparatus to control driving a vibratory actuator, wherein the vibratory actuator includes a vibrator provided with an electromechanical energy conversion device, includes one or more processors, and memory storing instructions that, when executed by the one or more processors, cause the control apparatus to perform operations including: applying a signal to the electromechanical energy conversion device to excite vibration on the vibrator and cause the vibrator and a driven object contacting the vibrator to move relative to one another by the vibration, wherein, in the case where the vibratory actuator decelerates, the executed instructions cause the control apparatus to perform operations including: changing a driving frequency of the signal to a frequency higher than a start-up frequency of the vibratory actuator and a preceding frequency at a deceleration start position, and, after changing the driving frequency of the signal, controlling the driving frequency of the signal to perform deceleration control, and fixing a voltage of the signal in a deceleration period in which the vibratory actuator is decelerated.

Further features of the present invention will become apparent from the following description of embodiments with reference to the attached drawings.

BRIEF DESCRIPTION OF THE DRAWINGS

FIGS. 6A to 6D are timing charts in a case where the control apparatus according to the embodiment drives the vibratory actuator.

FIGS. 9A and 9B are diagrams illustrating temporal variation of a rotation angle and a speed in a case where the vibratory actuator is driven to reciprocate the main mirror between an end "a" and an end "b".

DESCRIPTION OF THE EMBODIMENTS

Figure 1:
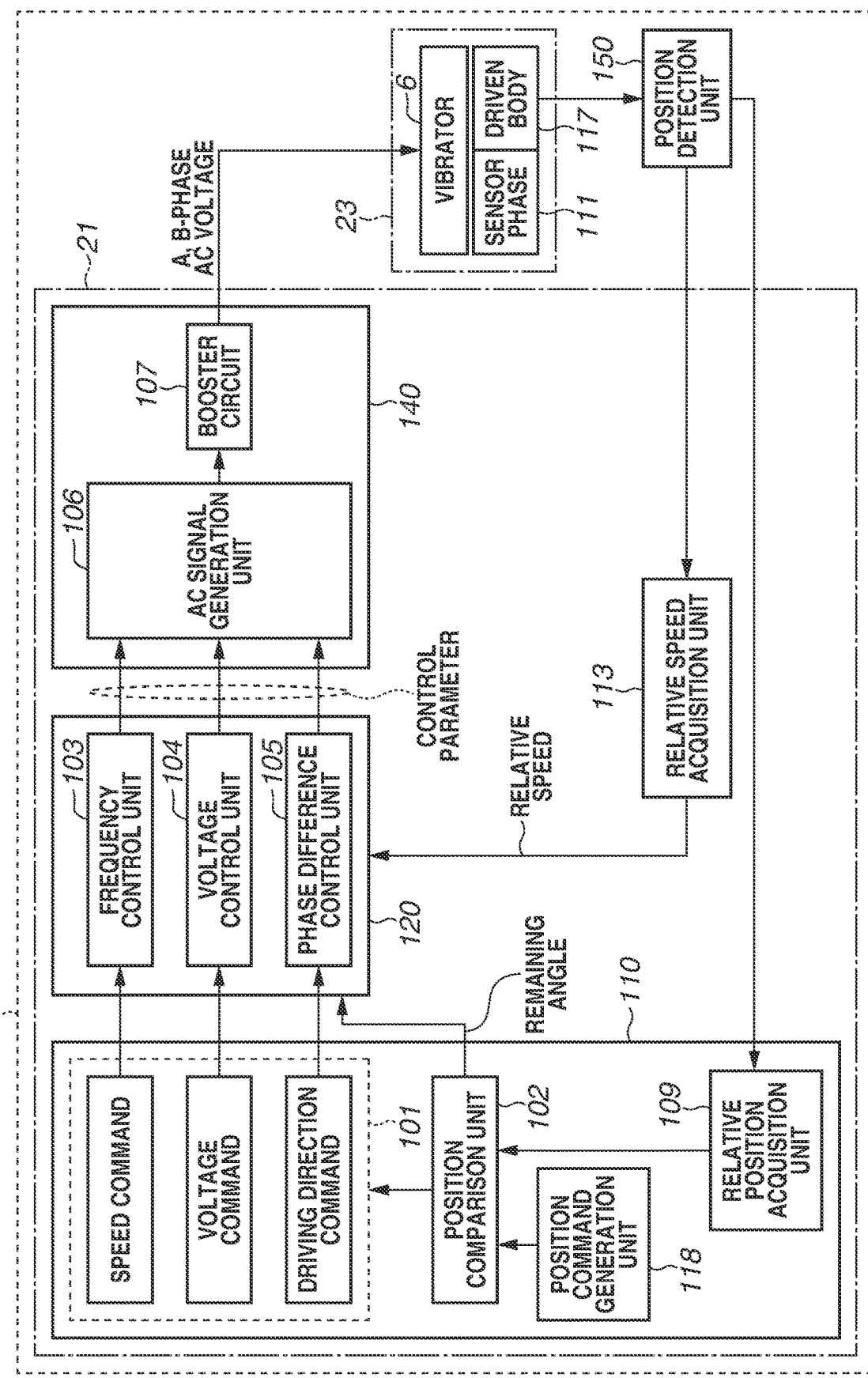
FIG. 1 is a block diagram illustrating a configuration of a driving apparatus according to an embodiment.

A driving apparatus 20 according to the present embodiment is described with reference to FIG. 1. FIG. 1 is a block diagram illustrating a configuration of the driving apparatus 20. The driving apparatus 20 is used in an imaging apparatus 30 illustrated in FIGS. 11A and 11B to move a mirror of the imaging apparatus 30 between a position where the mirror enters an imaging optical axis and a position where the mirror is retracted from the imaging optical axis. The imaging apparatus 30 is a digital single-lens reflex camera.

The driving apparatus 20 includes a vibratory actuator 23 and a control apparatus 21. The vibratory actuator 23 excites vibration in a vibrator 6 when an (alternating-current) signal is applied from the control apparatus 21 to an electromechanical energy conversion device. Further, the vibratory actuator 23 is a motor that provides driving force to a driven object 33 connected to the vibratory actuator 23 when the vibrator and a driven body 117 are relatively moved by the excited vibration.

The mirror is conventionally driven by a spring charge system, an electromagnetic motor driving system, etc. In a case where the driving speed of the mirror needs to be faster than before due to increase of frame speed in capturing an image, a brake may not sufficiently take hold at a time when the mirror reaches an end part if the driving speed of the mirror is increased in a conventional driving system. As a result, the mirror may collide at high speed with a positioning dowel that is a contact member disposed at the end part. In addition, controllability may be deteriorated due to backlash of a gear or a link part. In contrast, if the driving apparatus 20 is used as the vibratory actuator, fast acceleration and fast deceleration of the mirror becomes possible by taking advantage of its feature of frictional driving. Moreover, by using the driving apparatus 20 according to the present embodiment, it becomes possible to decelerate with stability after moving the mirror at high speed, and to stop the mirror at the end of a moving range with high accuracy as compared with the conventional driving system.

Configuration of Imaging Apparatus

Figure 11A:
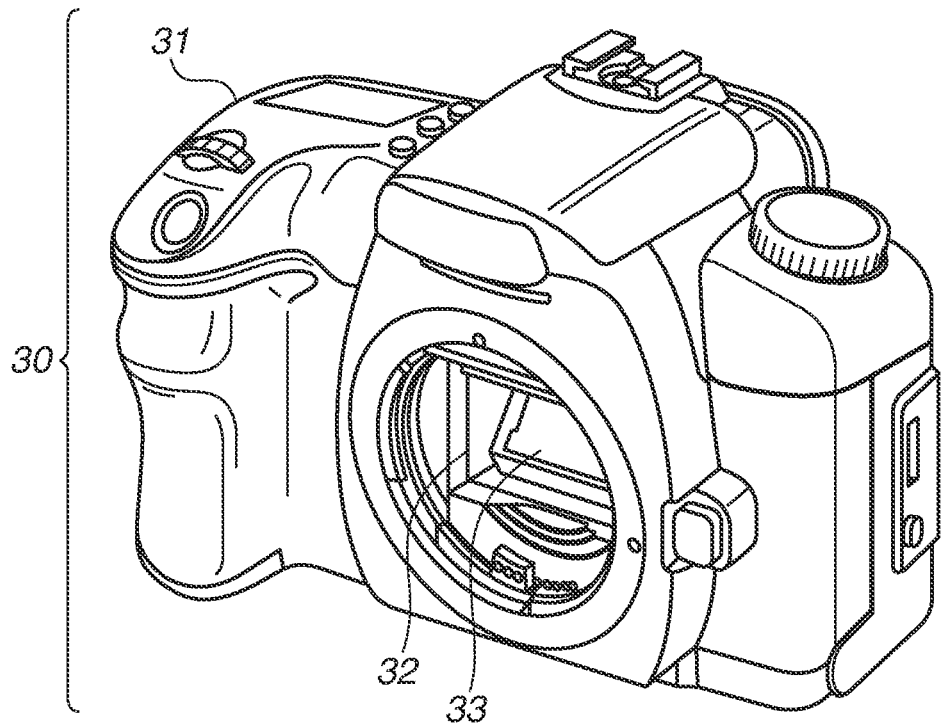
FIGS. 11A and 11B are schematic diagrams illustrating a configuration of an imaging apparatus according to the embodiment.

A configuration of the imaging apparatus 30 is described with reference to FIG. 11A and FIG. 11B. FIG. 11A is a schematic diagram of the imaging apparatus 30 without an imaging lens, as viewed from object side. A camera main body 31 includes a mirror box 32 to which imaging light flux which has passed through an imaging lens (not illustrated) is guided, and a mirror is disposed within the mirror box 32. The mirror includes a main mirror (quick return mirror) 33 and a sub-mirror 35. An imaging unit (not illustrated) is provided on the imaging optical axis behind the imaging lens.

Figure 11B:
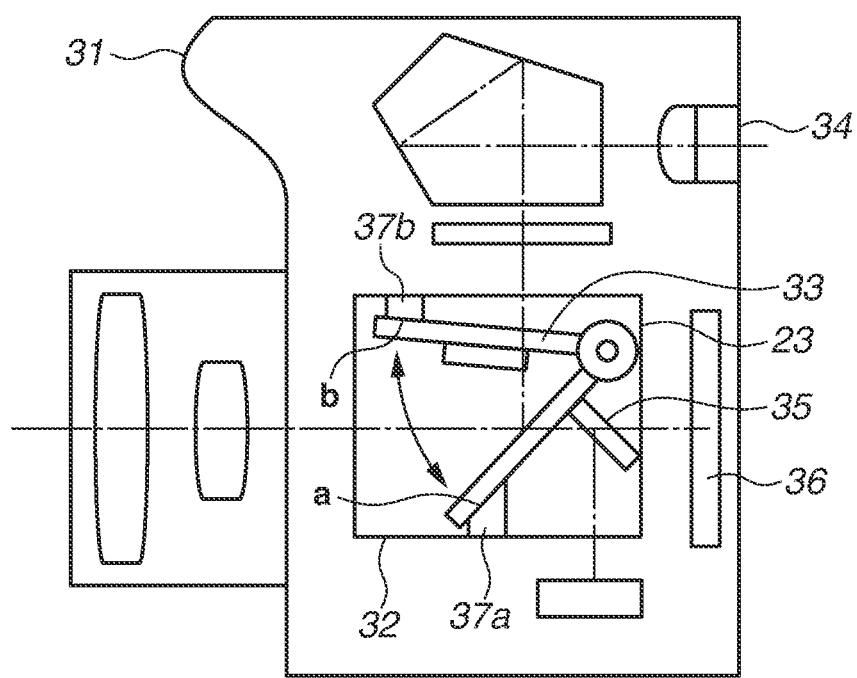

FIG. 11B is a schematic diagram of a cross-section of the camera main body 31 illustrating the configuration of the camera main body 31. The imaging unit of the camera main body 31 includes an imaging device 36 as a light receiving device that converts a received object image into an electric signal, such as a charge-coupled device (CCD) sensor and a complementary metal-oxide semiconductor (CMOS) sensor.

The main mirror 33 and the sub-mirror 35 can assume two states, that is, a state where both mirrors are disposed at an angle of 45 degrees to the imaging optical axis in order to allow a photographer to observe the object image through a finder eyepiece window 34, and a state where both mirrors are disposed at a position retracting from the imaging optical axis in order to guide the light toward the imaging device 36. In other words, the main mirror 33 and the sub-mirror 35 are movable between a position where the mirrors enter the imaging optical axis and a position where the mirrors are retracted from the imaging optical axis.

To increase the frame speed when the camera captures an image, it is necessary to reciprocate the main mirror 33 and the sub-mirror 35 at high speed to speed up switching between the above-described two states. In the present embodiment, the main mirror 33 and the sub-mirror 35 are moved within a moving range with use of the driving apparatus 20. As a result, the main mirror 33 and the sub-mirror 35 are reciprocated at high speed to perform switching between the above-described two states. In other words, the main mirror 33 and the sub-mirror 35 are driven objects which are moved by the driving apparatus 20. In the following description, the main mirror 33 and the sub-mirror 35 that are the driven objects of the driving apparatus 20 are referred to as mirrors in some cases.

In the present embodiment, an output shaft 10 of the vibratory actuator 23 of the driving apparatus 20 is coupled to a drive shaft of the main mirror 33, and the main mirror 33 is reciprocated by rotational driving force of the vibratory actuator 23. The sub-mirror 35 and the main mirror 33 are coupled through a link mechanism and integrally rotate.

The drive shaft of the main mirror 33 and the vibratory actuator 23 may be coupled to each other directly or through a gear, a link mechanism, etc. In the present embodiment, the main mirror 33 and the vibratory actuator 23 are connected to each other. However, the embodiment is not limited thereto, and the sub-mirror 35 and the vibratory actuator 23 may be connected to each other directly or through a gear, a link mechanism, etc.

The mirror box 32 includes, at both ends of the moving range of the main mirror 33, a first contact member 37a and a second contact member 37b that abut and contact the main mirror 33 to stop the main mirror 33 in the above-described two states relative to the imaging optical axis.

The vibratory actuator 23 of the driving apparatus 20 generates the driving force, and moves the main mirror 33 and the sub-mirror 35 within the moving range by the driving force. In the imaging apparatus 30, the main mirror 33 that is in contact with the first contact member 37a in a stationary state, is accelerated and moved toward the second contact member 37b, and is then decelerated and stopped at the second contact member 37b. This operation is referred to as mirror-up operation. Further, in the imaging apparatus 30, the main mirror 33 that is in contact with the second contact member 37b in a stationary state, is accelerated and moved toward the first contact member 37a, and is then decelerated and stopped at the first contact member 37a. This operation is referred to as mirror-down operation. The imaging apparatus 30 controls the driving force of the vibratory actuator 23 to alternately perform the mirror-up operation and the mirror-down operation, thereby reciprocating the main mirror 33 within the moving range at high speed.

When the imaging apparatus 30 according to the present embodiment performs the mirror-up operation or the mirror-down operation, deceleration is started before the end of the moving range that is a target stop position. The deceleration control is performed through control of a frequency of the alternating-current signal by the control apparatus 21 while the voltage of the alternating-current signal to be applied to the vibratory actuator 23 is fixed. More specifically, when the deceleration of the main mirror 33 is started before the end of the moving range, the frequency (driving frequency) of the alternating-current signal to be applied to the vibratory actuator 23 is first shifted to a frequency higher than a start-up frequency f0 to apply strong braking force to the main mirror 33 at a deceleration start position. After that, the driving speed of the vibratory actuator 23 is controlled using the driving frequency of the alternating-current signal.

In a conventional control method, the driving voltage is reduced to fast decelerate the motor in order to avoid impact of the moving object abutting on the contact member. However, in the case where the braking force is obtained through reduction of the driving voltage, the speed in the deceleration varies by a large amount, which makes it difficult to secure accuracy. For example, if the brake strongly takes hold, the mirror is stopped before the contact member, accordingly stopping accuracy is not secured. Further, in a case where deceleration is performed such that the main mirror 33 surely abuts on the contact member in the imaging apparatus 30 according to the present embodiment, there is a danger that the main mirror 33 may not be sufficiently decelerated and may abut on the contact member at high speed. As a result, the mirror may bounce without stopping after the motor is stopped, or the main mirror 33 may collide with the contact member 37a or 37b to stop in a returned-back state.

In contrast, the driving apparatus 20 according to the present embodiment crosses the start-up frequency and instantaneously shifts the driving frequency of the vibratory actuator 23 to a high frequency, at the time of decelerating the mirror. As a result, the driving speed is drastically reduced, which makes it possible to apply strong braking force to the mirror. After that, the driving apparatus 20 stops driving of the vibratory actuator 23 while performing proportional-integral-derivative (PID) control of the driving frequency at the fixed driving voltage. If the driving voltage is fixed in a deceleration period, speed control becomes more stable than the conventional control method during the deceleration, which stably decelerates the mirror as the driving object as compared with the conventional control method. Accordingly, it is possible to accurately stop the mirror as the driven object at the ends "a" and "b" without fluctuation as compared with the conventional control method.

In addition, it is necessary to stand by waiting for the imaging operation until vibration of the mirror falls within an allowable range after the mirror is moved to the end "a" or "b". The embodiment makes it possible to stably control the mirror speed when the mirror reaches the end "a" or "b" to reduce vibration of the mirror. Therefore, it is possible to reduce time that the vibration of the mirror takes to reach the allowable range. As a result, it is possible to refine the frame speed at the time of capturing an image by the camera. The detail of the configuration of the control apparatus 21 and the control method are described below.

Configuration of Driving Apparatus

Vibratory Actuator

The vibratory actuator 23 is a rod-shaped vibratory actuator that includes the rod-shaped vibrator 6, the driven body 117, and a sensor phase 111. The vibratory actuator 23 is an ultrasonic motor that generates circular movement or ellipsoidal movement at a friction portion of the rod-shaped vibrator 6, and relatively rotates the driven body 117 that is in press contact with the friction portion. The vibratory actuator 23 is used as an actuator to drive, for example, a mirror, a shutter, and a lens provided in the camera. The sensor phase 111 electrically detects a vibration state of the vibrator 6.

Figure 10A:
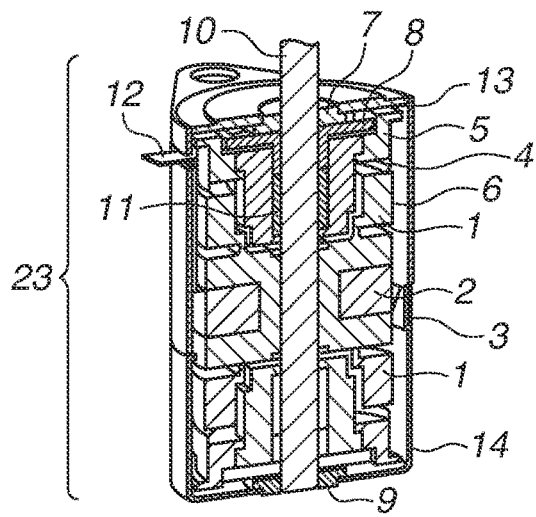
FIGS. 10A to 10C are schematic diagrams illustrating a configuration of the vibratory actuator according to the embodiment.
Figure 10B:
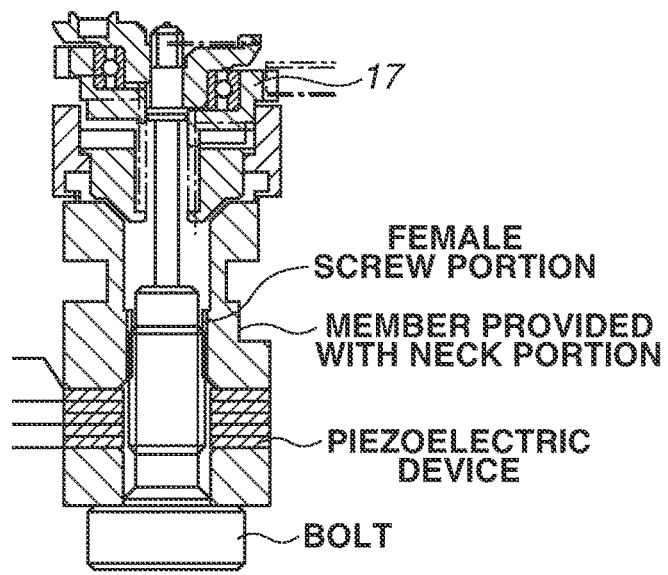
Figure 10C:
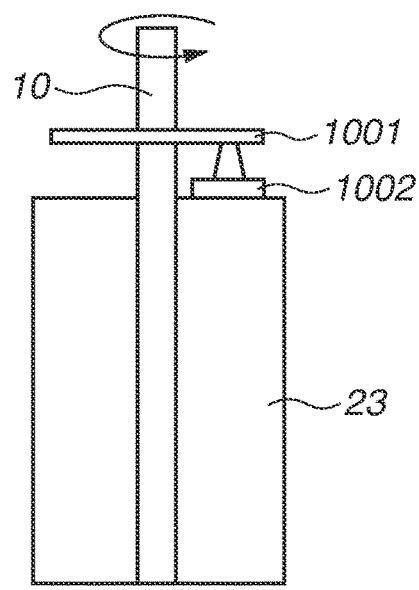

The configuration of the vibratory actuator 23 is described with reference to FIGS. 10A to 10C. FIGS. 10A to 10C are schematic diagrams illustrating the configuration of the vibratory actuator 23.

In FIG. 10A, the vibratory actuator 23 includes the rod-shaped vibrator 6 and a rotor 5 that is in press contact with the friction portion of the vibrator 6.

The vibrator 6 includes two vibration width expanding members 1, a piezoelectric device 2, a flexible printed board 12, and a supporting member 3 supporting these members. In the vibration width expanding members 1, the friction portion, a neck portion, and a holding portion are integrally provided. The piezoelectric device 2 serves as the electromechanical energy conversion device. The flexible printed board 12 supplies power to the piezoelectric device 2. The two vibration width expanding members 1 hold and fix the piezoelectric device 2, the flexible printed board 12, and the supporting member 3 to configure the rod-shaped vibrator 6.

A bearing 7 is press fitted into an inner diameter portion of the vibratory actuator 23 to position the vibrator 6 relative to the output shaft 10. The vibrator 6 synthesizes two bending vibrations to generate swing movement at both ends owing to the voltage applied to the piezoelectric device 2. The swing movement generates circular or ellipsoidal movement on a friction sliding surface of the friction portion at the both ends.

The rotor 5 is the driven body 117 that is in press contact with the vibrator 6. A friction member 4 is bonded to the rotor 5 through an adhesive, brazing or welding. The friction member 4 is fabricated with use of stainless steel through press working, and includes steps. An end surface of the friction member 4 is pressed against the friction sliding surface by a pressurizing spring 11. Accordingly, the rotor 5 and the vibrator 6 are relatively moved by the circular or ellipsoidal movement generated at the friction portion of the vibrator 6. In the configuration according to the present embodiment, the rotor 5 is rotated.

Rotational force of the rotor 5 is transmitted to the output shaft 10 through a rotation stopper. Reaction force by the pressurizing spring 11 is received by two pressure receiving members 8. The pressure receiving members 8 are bonded to the output shaft 10 and the rotation stopper with an adhesive. Therefore, the rotational force of the rotor 5 is surely transmitted to the output shaft 10. The pressure receiving members 8 may be bonded to the output shaft 10 and the rotation stopper through, for example, spot welding with laser or brazing instead of an adhesive. The output shaft 10 is supported by a case-side bearing 9. A case is separated into two members 13 and 14 that sandwich and fix the supporting member 3 supporting the entire vibrator 6.

In the present embodiment, the mirror drive shaft and the output shaft 10 of the vibratory actuator 23 are coupled to each other to rotationally move the mirror of the imaging apparatus 30. At this time, an optical sensor 1002 that faces a disc scale 1001 provided on the output shaft 10 as illustrated in FIG. 10C, detects light reflected by the disc scale 1001 to detect the rotation position and the speed of the mirror.

The configuration of the driving apparatus 20 is described below with reference to FIG. 1.

Position Detection Unit

A position detection unit 150 is a position sensor that acquires a position of the driven body 117. As the position detection unit 150, for example, a rotary encoder or a linear encoder is used. A detection result of the position detection unit 150 is transmitted to a relative position acquisition unit 109 and a relative speed acquisition unit 113 of the control apparatus 21.

Control Apparatus

The control apparatus 21 controls driving of the vibratory actuator 23. More specifically, the control apparatus 21 applies an A-phase alternating-current voltage and a B-phase alternating-current voltage to the piezoelectric device 2, thereby driving the vibratory actuator 23. At this time, the control apparatus 21 adjust at least one of the frequency, the voltage, and a phase difference of the plurality of alternating-current voltages to be applied to the piezoelectric device 2, thereby controlling the speed of the rotor 5, namely, driving force generated by the vibratory actuator 23. Controlling the driving force of the vibratory actuator 23 makes it possible to control the moving speed, the moving direction, etc. of the mirror as the driven object.

The configuration of the control apparatus 21 is described with reference to FIG. 1. In the following description, the phrase "vibratory actuator 23 is driven" indicates that the relative position and speed of the driven body 117 and the vibrator 6 are controlled through control of the two bending vibration excited on the vibrator 6. Further, for convenience, the following description is given assuming that the vibrator 6 is fixed to an unillustrated fixing unit, and the control apparatus 21 drives the vibratory actuator 23 so as to move the driven body 117 as a moving body relative to the vibrator 6.

The control apparatus 21 includes a command unit 110, the relative speed acquisition unit 113, a control amount determination unit 120, and a driving unit 140.

The command unit 110 includes various kinds of electronic devices and electric components such as a central processing unit (CPU), a programmable logic device (PLD, including application specific integrated circuit (ASIC)), a read only memory (ROM), a random access memory (RAM), and an analog-to-digital (A/D) converter. The command unit 110 generates a signal including information to control driving of the vibratory actuator 23. The command unit 110 includes a command value determination unit 101, a position comparison unit 102, a position command generation unit 118, and the relative position acquisition unit 109.

The position command generation unit 118 outputs a target position of the mirror 33. The relative position acquisition unit 109 acquires a relative position of the driven body 117 based on an output signal that is the detection result of the position detection unit 150.

The position comparison unit 102 is a calculation unit that sequentially calculates a deviation between the target position output from the position command generation unit 118 and the relative position acquired by the relative position acquisition unit 109. In the present embodiment, the position comparison unit 102 acquires the deviation between a target rotation angle as the target position and the detected rotation angle of the mirror because the mirror is rotationally driven. For example, in a case where the mirror is moved from the state where the mirror is in contact with the first contact member 37a to the position where the mirror comes into contact with the second contact member 37b, the deviation that is obtained by subtracting the rotation angle of the mirror from a rotation angle necessary for movement of the mirror from the first contact member 37a to the second contact member 37b, is used as a remaining angle. The deviation acquired by the position comparison unit 102 is transmitted to the command value determination unit 101 and the frequency control unit 103.

The command value determination unit 101 acquires various command values respectively including information of the speed, the voltage, the driving detection, etc., based on the acquired deviation, and outputs a signal. The command value determination unit 101 is not limited to the configuration determining the various command values with use of the deviation as with the present embodiment, and may have a configuration acquiring the various command values with use of the rotation angle of the mirror, the moving speed of the driven object, the rotation speed of the motor, etc. The configuration using the deviation such as the remaining angle is preferable because the configuration allows for control with higher accuracy.

In the present embodiment, the mirror is rotated with use of the vibratory actuator. Alternatively, the driven object may be translated with use of the vibratory actuator. In that case, the command value determination unit 101 acquires the various command values with use of, as the deviation, the value (remaining distance) that is obtained by subtracting a distance to the driven object from the distance of the target position, or acquires the various command values with use of the moving distance or the moving speed of the driven object, the rotation speed of the motor, etc. as described above.

The relative speed acquisition unit 113 acquires the relative speed of the driven body 117 based on the signal output from the position detection unit 150.

The control amount determination unit 120 includes the frequency control unit 103, a voltage control unit 104, and a phase difference control unit 105. The control amount determination unit 120 determines the control amounts of the frequency, the voltage, and the phase difference of the plurality of alternating-current signals to be applied to the vibratory actuator 23, based on the signal from the command unit 110, the deviation (remaining deviation) to the target position of the mirror, the relative speed, etc. More specifically, the frequency control unit 103 determines the frequencies of the alternating-current voltages as the alternating-current signals, the voltage control unit 104 determines a duty ratio of the alternating-current signals, and the phase difference control unit 105 determines the phase difference between the alternating-current signals.

Figure 2:
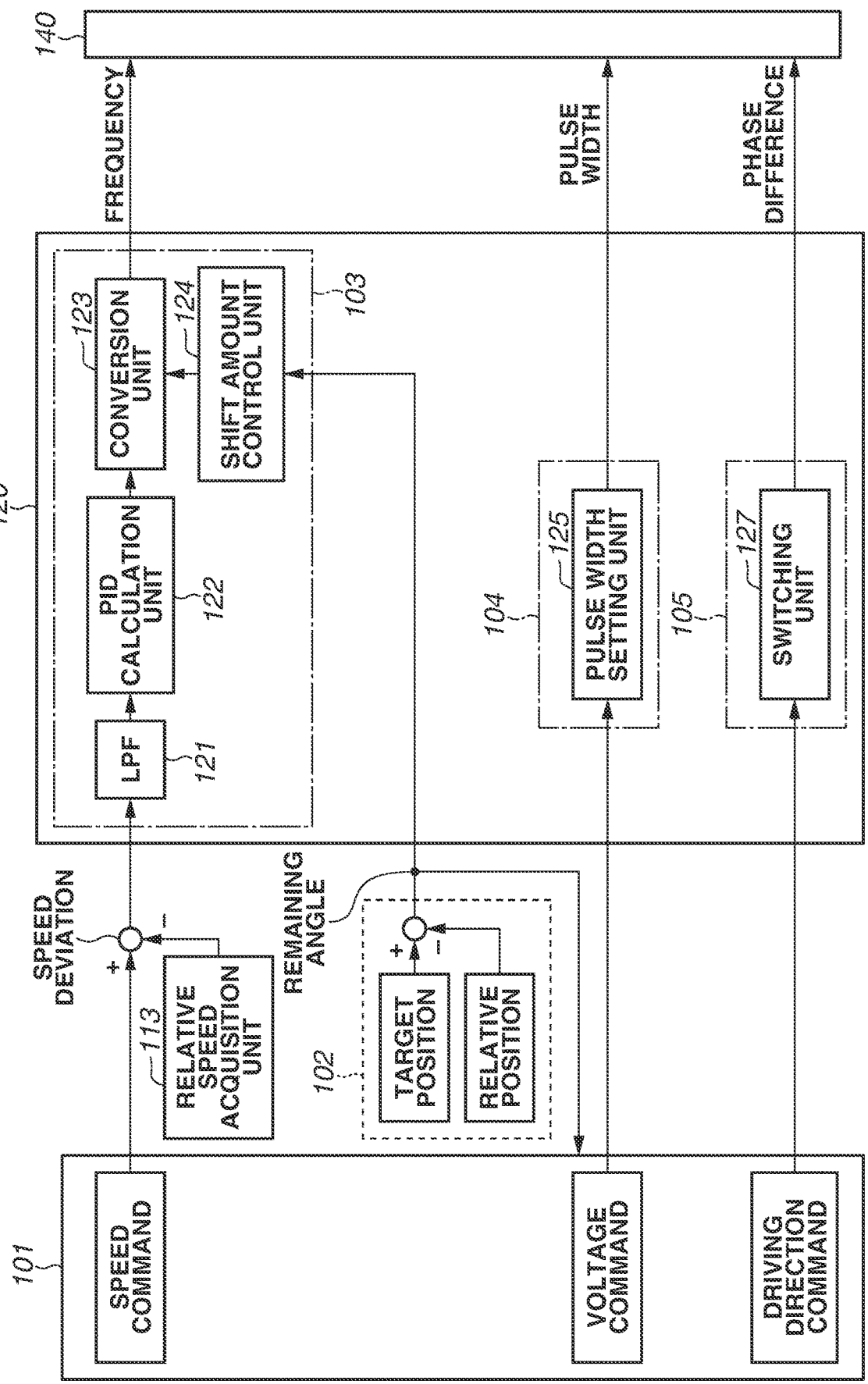
FIG. 2 is a block diagram illustrating a configuration of a control amount determination unit in a control apparatus according to the embodiment.

The configuration of the control amount determination unit 120 is described with reference to FIG. 2. FIG. 2 is a block diagram illustrating the configuration of the control amount determination unit 120 in the control apparatus 21.

The frequency control unit 103 uses a difference (speed deviation) between a command speed from the command value determination unit 101 and a relative speed from the relative speed acquisition unit 113 to control the frequency of the plurality of alternating-current signals to be applied to the vibratory actuator 23 such that the mirror is moved at the command speed. More specifically, the speed deviation is calculated with use of the command speed from the command value determination unit 101 and the relative speed from the relative speed acquisition unit 113, and the calculated speed deviation is provided to the frequency control unit 103. The speed deviation is calculated by a low-pass filter (LPF) 121 and a PID calculation unit (deviation calculation unit) 122 described below. On the other hand, a shift amount control unit 124 uses the remaining angle from the position comparison unit 102 to acquire a frequency shift amount (hereinafter, referred to as "shift amount"). A PID calculation amount (deviation calculation amount) and the shift amount are provided to a conversion unit 123, and a control amount obtained through addition thereof is provided as the driving frequency to the driving unit 140.

Figure 3:
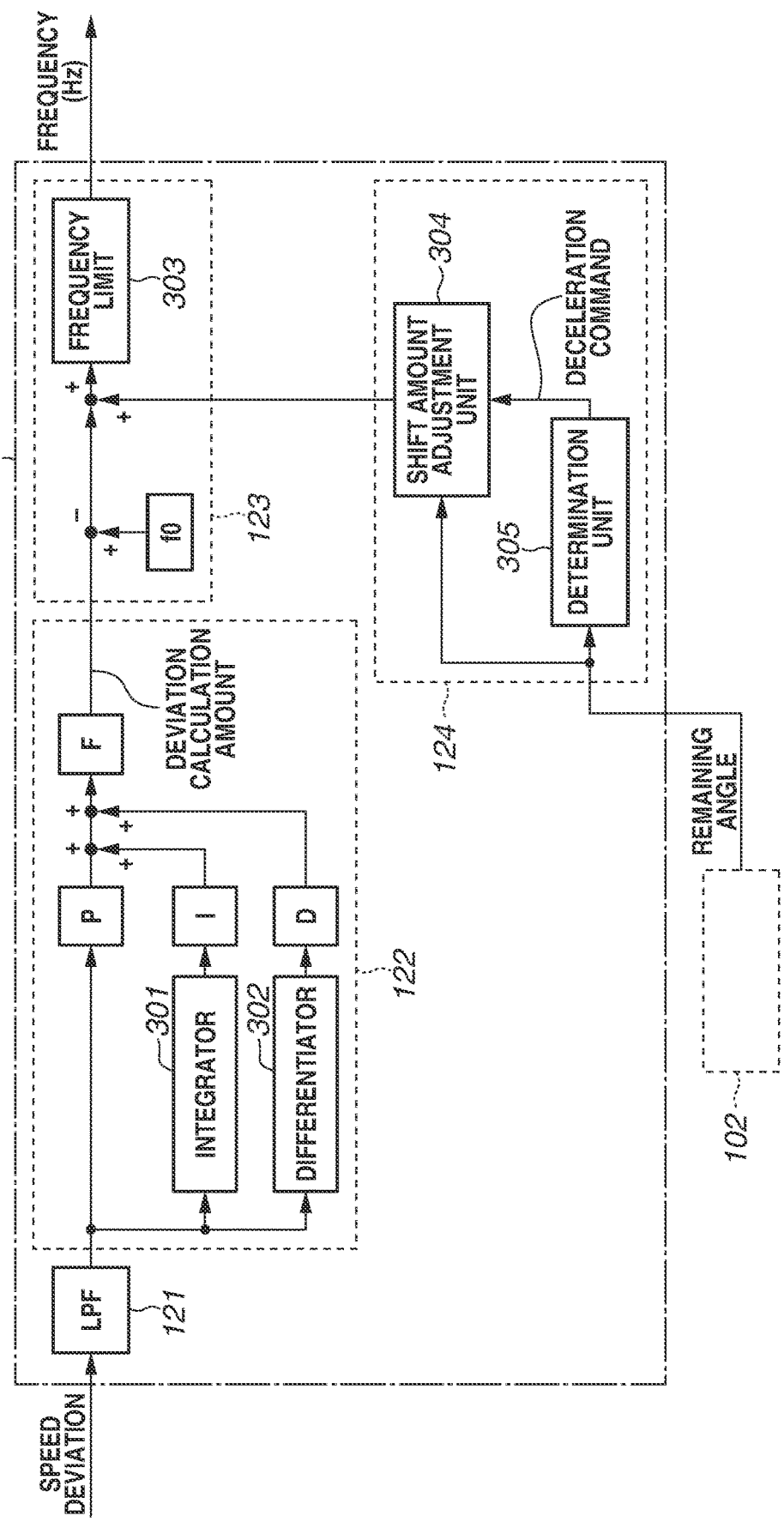
FIG. 3 is a block diagram illustrating a configuration of a frequency control unit in the control apparatus according to the embodiment.

The configuration of the frequency control unit 103 is described with reference to FIG. 3. FIG. 3 is a block diagram illustrating the configuration of the frequency control unit 103. The frequency control unit 103 includes the LPF 121, the PID calculation unit 122, the conversion unit 123, and the shift amount control unit 124.

The LPF 121 acquires the speed deviation that is calculated with use of the command speed from the command value determination unit 101 and the relative speed from the relative speed acquisition unit 113, and cuts high-frequency noise of the acquired speed deviation. A signal output from the LPF 121 is provided to the PID calculation unit 122. The PID calculation unit 122 includes an integrator 301 and a differentiator 302, adds results of multiplication of the signal and a proportional gain (P), an integral gain (I), and a differential gain (D), and multiplies an addition result by a frequency gain (F).

On the other hand, the shift amount control unit 124 outputs a shift amount with use of the remaining angle from the position comparison unit 102. The shift amount control unit 124 includes a determination unit 305 and a shift amount adjustment unit 304. When the remaining angle becomes equal to or lower than a predetermined value, the determination unit 305 takes the positon of the remaining angle as a deceleration start position, and outputs a command to start deceleration. The shift amount adjustment unit 304 outputs a shift amount of the frequency for each control period, based on the deceleration command from the determination unit 305. The fixed shift amount may be output at the same time as the deceleration command is received until the vibratory actuator 23 is stopped, or the shift amount that is acquired through calculation or with use of a table based on the variation of the remaining angle may be output.

The conversion unit 123 receives the PID calculation amount from the PID calculation unit 122 and shift amount from the shift amount control unit 124 for each control period, and converts these amounts into a frequency that is one of control amounts to drive the vibratory actuator 23. More specifically, the PID calculation amount is subtracted from the start-up frequency f0 set at the drive start time, and the shift amount is added to the subtraction result. Thereafter, the maximum frequency and the minimum frequency are limited by a frequency limit 303 to output the resultant frequency.

As described above, the frequency control unit 103 controls the driving frequency to perform speed control of the vibratory actuator 23.

Figure 4A:
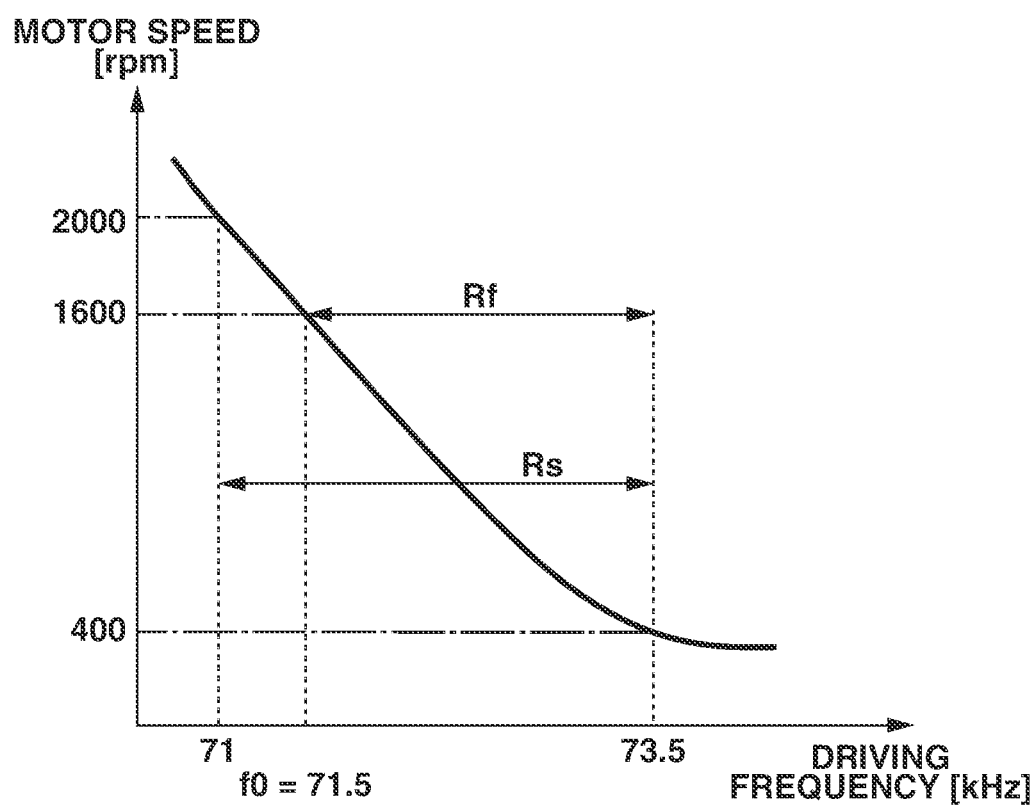
FIG. 4A is a diagram illustrating relationship between a driving frequency of an alternating-current voltage to be applied to a vibratory actuator and a motor speed.

FIG. 4A is a diagram illustrating relationship between the driving frequency of the alternating-current signal to be applied to the vibratory actuator 23 and the driving speed of the vibratory actuator 23, and a horizontal axis indicates the driving frequency and a vertical axis indicates the driving speed. To accelerate the vibratory actuator 23 up to 2000 rpm on high-speed side in a shorter time, a frequency close to 2000 rpm is used as the frequency at the drive start time (start-up frequency). For example, in the present embodiment, the start-up frequency is set close to 71 kHz. At this time, to perform smooth acceleration, the start-up frequency is set to a frequency a little higher than 71 kHz. For example, in a case where the control is performed at the maximum speed of 2000 rpm, the vibratory actuator 23 can be smoothly accelerated to the maximum speed in a short time when the vibratory actuator 23 is started up at the start-up frequency f0 of 71.5 kHz.

In a case where the mirror as the driven object is decelerated near the end "a" or "b", the control apparatus according to the present embodiment uses the higher frequency distant from the start-up frequency f0. More specifically, the driving frequency is shifted to the frequency higher than the start-up frequency f0 and the preceding frequency, at the deceleration start position at which deceleration is started. At this time, the preceding frequency is preferably lower than the start-up frequency f0, and the driving frequency is preferably instantaneously shifted to the higher frequency across the start-up frequency f0 at the deceleration start position. Such a configuration makes it possible to enhance braking force, and to perform deceleration more stably than deceleration by the conventional configuration in a short time. For example, the driving frequency is shifted to 73.5 kHz at the deceleration start position. In the control using only the PID calculation amount of the speed deviation, the driving frequency is gently shifted to the high frequency based on the start-up frequency f0. Therefore, the driving frequency is not instantaneously controlled to reach the high frequency, and it is accordingly difficult to perform deceleration operation in a short time.

Figure 4B:
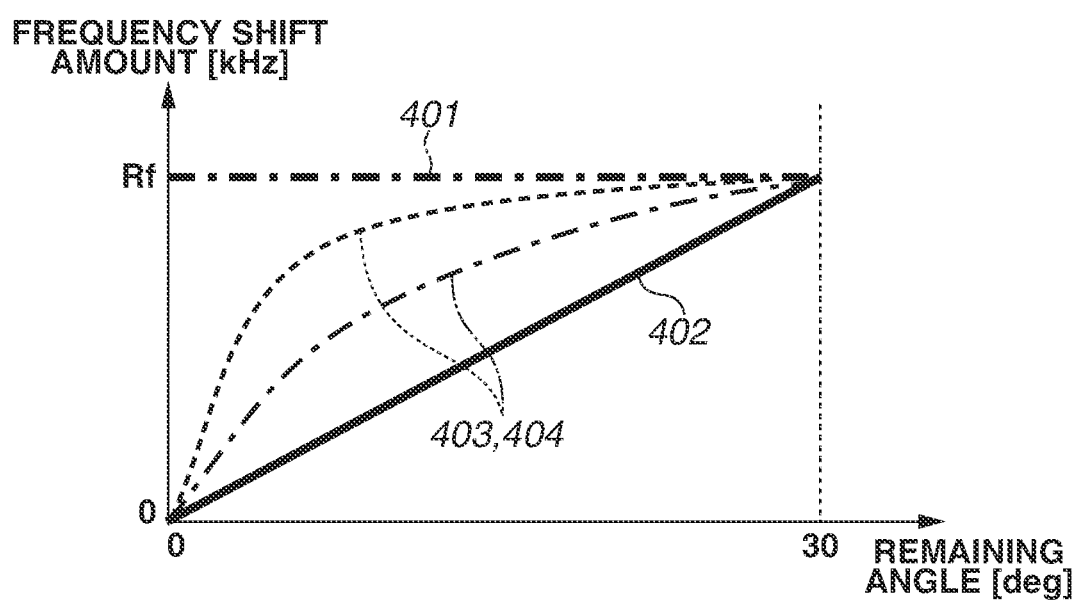
FIG. 4B is a diagram illustrating a remaining angle and a frequency shift amount.

FIG. 4B is a diagram illustrating an example of the shift amount output from the shift amount control unit 124, and a horizontal axis indicates the remaining angle, and a vertical axis indicates the shift amount. The shift amount is controlled according to the remaining angle, and the shift amount is added to the PID calculation amount to perform control in deceleration, which refines deceleration performance. As a simple method, the fixed shift amount can be output without changing from the shift amount at the deceleration start position, as illustrated by a straight line 401. Alternatively, the shift amount may be controlled so as to change according to the remaining angle. For example, the shift amount may be linearly changed according to the remaining angle as illustrated by a straight line 402, or may be varied with use of a function as illustrated by a curved line 403 or 404. By changing the shift amount linearly or curvedly, the braking force can be freely controlled according to the remaining angle. After the driving frequency is shifted to the frequency higher than the start-up frequency at the deceleration start position, the shift amount may not be used and the driving frequency may be fixed to the high frequency. At the deceleration start time that requires the largest braking force, the shift amount is set to a maximum value Rf at the position of the remaining angle as the deceleration start position (in present embodiment, 30 degrees).

Here, a case is described as an example where the maximum value Rf is set to 2 kHz, and the shift amount is controlled so as to linearly change according to the remaining angle. The actuator 23 is started up at the start-up frequency f0 of 71.5 kHz, and is driven near the frequency of 71 kHz based on the PID calculation amount until the speed reaches the maximum speed. Thereafter, the shift amount is added to the PID calculation amount and the frequency is instantaneously changed up to 73.5 kHz at the deceleration start position. Thereafter, the PID control of the driving frequency is performed based on the value obtained through addition of the PID calculation amount and the shift amount at the fixed driving voltage. The shift amount is reduced as approaching the target position, and the shift amount becomes 0 kHz and the driving frequency becomes f0 at the target position. At this time, the control unit 21 performs the frequency control at the fixed driving voltage during the deceleration period from the deceleration start position to the target stop position. The frequency control unit 103 controls the driving frequency within a range Rs (range from minimum value to maximum value of driving frequency both inclusive). Accordingly, the driving frequency is controlled within a range wider than a range (Rs-Rf) of the driving frequency that is controlled with use of only the PID calculation amount without use of the shift amount. The above-described frequency gain (F) is preferably set using the speed variation rate as a guide that is a gradient of a characteristic curve of the driving frequency and the motor speed.

If the driving frequency is changed from a frequency lower than the start-up frequency to the driving frequency (taken as maximum frequency) that is movable at minimum driving speed, at the deceleration start time, it is possible to obtain the largest braking force. The maximum frequency is a frequency higher than the start-up frequency. In the case where the driving frequency is shifted to the high frequency at the deceleration start potion, the driving frequency is preferably set equal to or lower than the maximum frequency. Therefore, the shift amount is preferably at least larger than a difference between the preceding frequency and the start-up frequency, and equal to or smaller than the difference between the preceding frequency and the maximum frequency.

The voltage control unit 104 controls a pulse width of the alternating-current signal to be applied to the vibratory actuator 23, thereby controlling an amplitude of the driving voltage. In the present embodiment, the voltage control unit 104 performs the control while fixing the voltage to a voltage including driving force sufficient to stably move the driven object within the controlled frequency range Rs, in order to realize stable deceleration operation in the frequency control. The fixed voltage may be constant from the drive start time or may be a predetermined voltage as long as being fixed. The phrase "voltage is fixed" used herein indicates that the amplitude of the driving voltage is fixed. The amplitude of the driving voltage may be controlled through control of the pulse width of the alternating-current signal.

The voltage control unit 104 includes a pulse width setting unit 125. The voltage control unit 104 changes the pulse width of the alternating-current voltage that is the alternating-current signal, based on a voltage command from the command value determination unit 101. The pulse width setting unit 125 sets the pulse width of the alternating-current signal based on the voltage command from the command value determination unit 101.

The phase difference control unit 105 includes a switching unit 127. The phase difference control unit 105 is a phase difference (+90/−90) switching unit that controls a phase difference of two-phase alternating-current signal to be applied to the vibratory actuator 23 based on a driving direction command from the command value determination unit 101, thereby controlling the relative moving direction of the vibrator 6 and the rotor 5. As a result, the phase difference control unit 105 switches the driving direction of the motor, namely, the rotating direction of the mirror. More specifically, the phase difference control unit 105 causes the switching unit 127 to switch the phase difference between +90 degrees and −90 degrees, based on the driving direction command provided from the command value determination unit 101. The phase difference from the switching unit 127 is provided as the control amount to the driving unit 140.

The driving unit 140 includes an alternating-current signal generation unit 106 and a booster circuit 107.

The alternating-current signal generation unit 106 generates the two-phase alternating-current signal, based on the control amount provided from the control amount determination unit 120. More specifically, the control amount output from the control amount determination unit 120 is provided to the alternating-current signal generation unit 106 of the driving unit 140, and the alternating-current signal generation unit 106 generates the alternating-current signal of a rectangular wave, based on the control amount of each of the frequency, the pulse width, and the phase difference provided from the control amount determination unit 120. As a result, the frequency, the pulse width, and the phase difference of the alternating-current signal (alternating-current pulse signal) for generating driving voltages VA and VB to be supplied to the vibratory actuator 23 are adjusted.

The alternating-current signal generation unit 106 includes, for example, a CPU, a function generator, and a switching circuit. The alternating-current signal generation unit 106 provides the generated two-phase alternating-current signal to the booster circuit 107.

The booster circuit 107 increases the voltage of the alternating-current signal provided from the alternating-current signal generation unit 106, to a predetermined voltage value, thereby generating the alternating-current driving voltages VA and VB. The generated driving voltages are applied to the piezoelectric device 2 of the vibrator 6. As a result, the driven body 117 is frictionally driven by the vibrator 6, and is rotated in a predetermined direction at predetermined speed.

As described above, the relative speed of the driven body 117 is detected by the position detection unit 150 and the relative speed acquisition unit 113, and is fed back to the control amount determination unit 120. In addition, the relative position acquisition unit 109 uses the detection result of the position detection unit 150 to acquire the relative position of the driven body 117, and feeds back the relative position of the driven body 117 to the command unit 110.

Figure 12A:
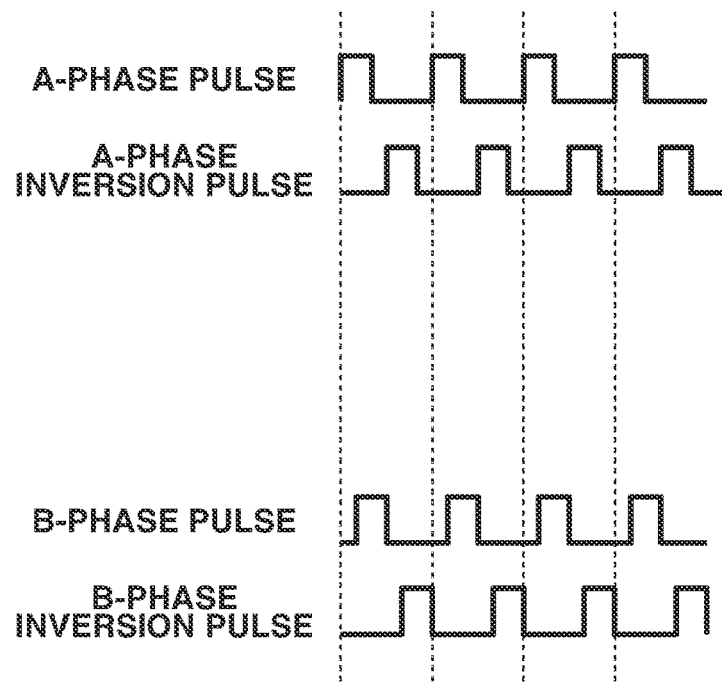
FIGS. 12A and 12B are block diagrams illustrating a driving unit according to the embodiment.
Figure 12B:
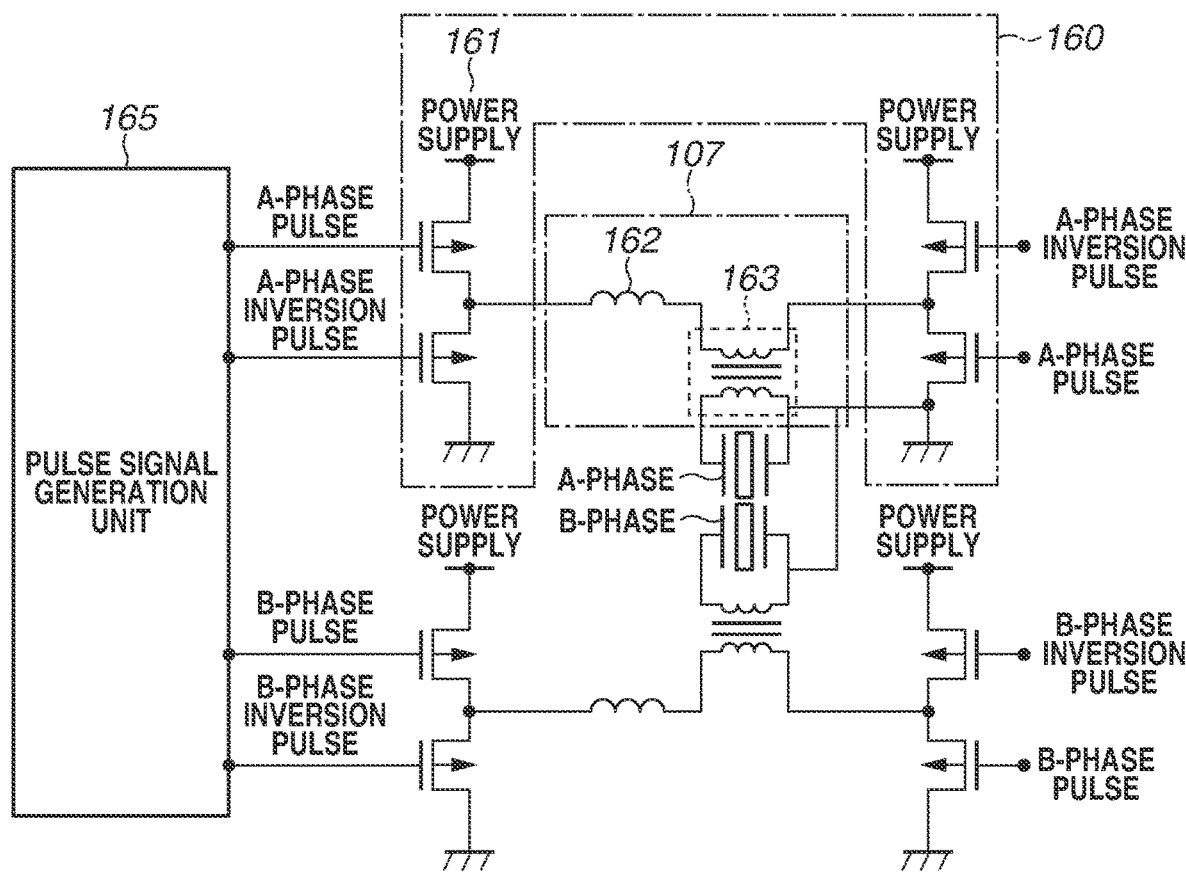

The configuration of the driving unit 140 is described with reference to FIG. 12B. FIG. 12B is a block diagram illustrating the configuration of the driving unit 140 according to the present embodiment. In the driving unit 140, the configurations of parts respectively used for generation of the driving voltages VA and VB to be applied to the piezoelectric device 2 are the same. Therefore, in the following description, the part used for generation of the driving voltage VA is described.

The alternating-current signal generation unit 106 includes a pulse signal generation unit 165 and a switching circuit 160. Further, the booster circuit 107 includes a coil 162 and a transformer 163. The configuration of the booster circuit 107 is not limited thereto, and the booster circuit 107 may include, for example, any one of the coil 162 and the transformer 163.

The pulse signal generation unit 165 generates, based on the information from the control amount determination unit 120, a rectangular A-phase pulse signal and an A-phase inversion pulse signal. The A-phase pulse signal includes information of a phase difference, a frequency, and a pulse width corresponding to the information from the control amount determination unit 120. The A-phase inversion pulse signal is shifted in phase by 180 degrees from the A-phase pulse signal. FIG. 12A illustrates the pulse signals generated by the pulse signal generation unit 165. The A-phase pulse signal and the A-phase inversion pulse signal generated by the pulse signal generation unit 165 are provided to the switching circuit 160.

The switching circuit 160 performs switching operation at timing of the pulse signal to which a direct-current voltage suppled from a power supply 161 has been input, thereby generating the alternating-current signal of a rectangular wave. In a case where the pulse width of each of the pulse signals generated by the pulse signal generation unit 165 is expressed by a duty ratio, the pulse width of the corresponding alternating-current signal generated by the alternating-current signal generation unit 106 is also expressed by the same duty ratio.

The alternating-current signal output from the alternating-current signal generation unit 106 is provided to the booster circuit 107. The voltage thereof is increased to the predetermined voltage value to be converted into the driving voltage VA of a sine wave, and the driving voltage VA is applied to one electrode (A-phase) of the piezoelectric device 2.

A B-phase pulse signal that is used for generation of the driving voltage VB to be applied to another electrode (B-phase) of the piezoelectric device 2 is generated so as to include, relative to the A-phase pulse signal, a predetermined phase difference based on the information of the phase difference provided from the control amount determination unit 120. A B-phase inversion pulse signal is generated so as to be shifted in phase by 180 degrees from the B-phase pulse signal. The driving voltage VB of a sine wave is generated in a manner similar to the driving voltage VA.

Method of Driving Vibratory Actuator

A method of controlling the vibratory actuator 23 by the control apparatus 21 is described with reference to FIGS. 5A and 5B, FIGS. 6A to 6D, and FIGS. 7A to 7D.

In the following description, the driving method is described in more detail using a case where the mirror is rotationally moved from the end "a" to the end "b" as an example. Further, also in a case where the main mirror 33 is moved from the end "b" to the end "a", the main mirror 33 is controlled in a manner similar to the following description except that the direction of the driving force and the moving direction of the main mirror 33 are reversed.

To rotate the main mirror 33, the control apparatus 21 first performs a first step (S1) of using the PID calculation amount that is the calculated deviation of the command speed and the detected speed, to output the driving frequency. The vibratory actuator 23 generates the driving force to drive the driven object up to the target position through the first step (S1).

More specifically, the control apparatus 21 turns on the driving pulse in response to the voltage command from the command value determination unit 101 based on the target position, and the pulse width setting unit 125 of the voltage control unit 104 sets the pulse width at the drive start time. As a result, the vibratory actuator 23 generates the driving force to rotationally move the mirror toward the end "b". In this example, the pulse width at the drive start time is set to 50%, and a target position A1 is set to 120 degrees that is a rotation angle from the end "a" to the end "b". The start-up frequency f0 is set to 71.5 kHz, and the driving frequency of the vibratory actuator 23 is controlled with use of the PID calculation amount of the speed deviation based on the start-up frequency f0. As a result, the mirror is accelerated up to the maximum speed.

The position comparison unit 102 uses the target position and the relative position to acquire the remaining angle to the target position. When the remaining angle becomes equal to or smaller than a value set as the deceleration start position, the command speed from the command value determination unit 101 is decreased according to the remaining angle, and the deceleration control is performed. In the following description, the set value of the remaining angle at which the deceleration is started is denoted by A2. Upon reaching the deceleration start position, the control apparatus 21 performs a second step (S2) of controlling the driving frequency of the alternating-current signal to be higher than the preceding driving frequency and the start-up frequency f0. In the second step (S2), the frequency control unit 103 adds the shift amount to the speed calculation amount (PID calculation amount of speed deviation) and outputs the driving frequency while the voltage control unit 104 fixes the driving voltage to a value equal to or larger than the predetermined voltage. The driving frequency of the vibratory actuator 23 is controlled to be the frequency higher than the preceding frequency and the start-up frequency at the deceleration start position through such control. As a result, the brake instantaneously works on the vibratory actuator 23, and the mirror is accordingly decelerated. In the present embodiment, the frequency control unit 103 sets the set value A2 of the remaining angle at which the deceleration is started, to 30 degrees.

After performing the second step (S2), the control apparatus 21 performs a third step (S3). The control apparatus 21 performs the deceleration control with the frequency in response to the frequency control unit 103 which adds the shift amount to the PID calculation amount to output the driving frequency at the fixed driving voltage. When the mirror reaches the set position, the control apparatus 21 turns off the driving pulse of the vibratory actuator 23. In the present embodiment, the control apparatus 21 generates the driving force such that the mirror presses the second contact member 37b after the remaining angle becomes zero degrees. Alternatively, the voltage control unit 104 may switch the pulse width to 0% at the time when the remaining angle becomes zero degrees.

Figure 5A:
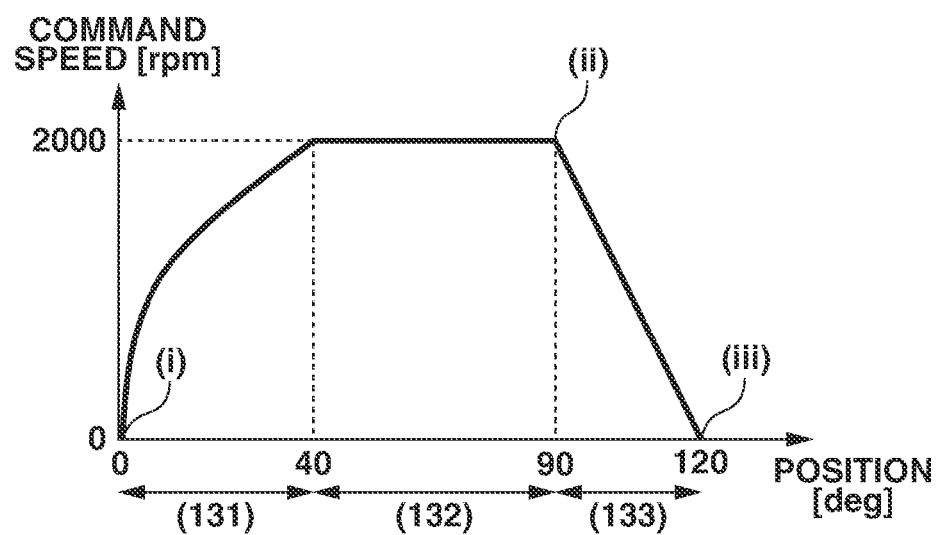
FIG. 5A is a diagram illustrating relationship between a position and a command speed in a case where a main mirror is rotationally driven.

The operation of the command value determination unit 101 for changing the command speed according to the position is described with reference to FIGS. 5A and 5B. FIG. 5A is a diagram illustrating relationship between the position and the command speed in the case where the main mirror is rotationally driven. As illustrated in FIG. 5A, the command value determination unit 101 controls the command speed based on the remaining angle from the position comparison unit 102.

In the present embodiment, an acceleration range (131), a maximum speed range (132), and a deceleration range (133) are defined according to the position of the mirror. First, in the acceleration range, the command value determination unit 101 controls the command speed to increase in a curved manner to 2000 rpm. In this case, the command speed is increased according to the position of the driven object as an example; however, for example, the command speed may be increased by time or by other method. Next, in the maximum speed range, the command value determination unit 101 controls the command speed to a fixed speed of 2000 rpm. In the deceleration range, the command value determination unit 101 reduces the command speed in proportion to the remaining angle. More specifically, the command value determination unit 101 sets the value A2 of the remaining angle at which the deceleration is started, to 30 degrees, calculates a ratio X of the remaining angle acquired for each sampling and the set value A2 (X=remaining angle/set value), and multiplies the ratio X by the maximum speed 2000 rpm, thereby linearly reducing the command speed. Therefore, the command speed is changed from 2000 rpm to 0 rpm as the position is changed from the deceleration start position toward the target position.

Figure 5B:
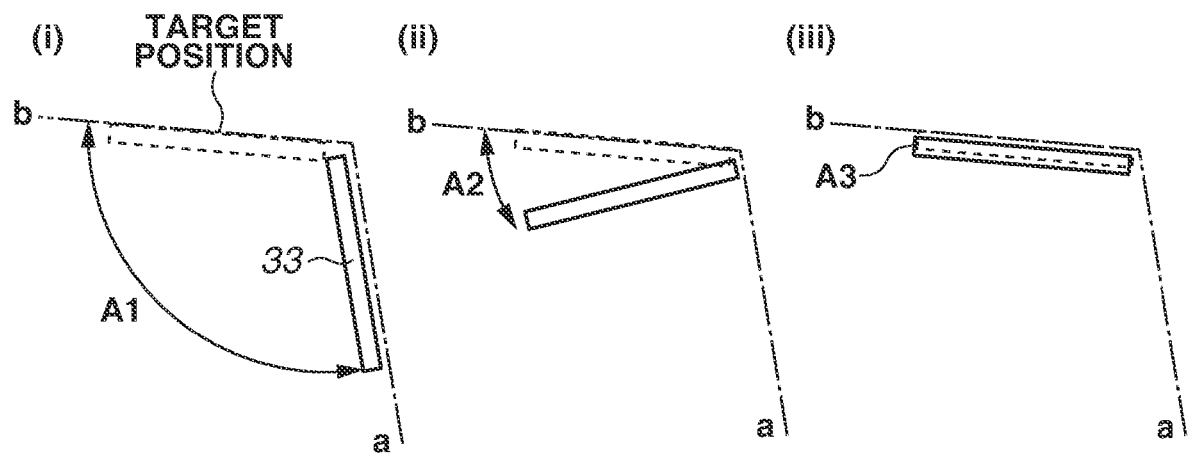
FIG. 5B is a diagram illustrating a state of the main mirror.

FIG. 5B is a diagram illustrating states of the main mirror. In FIG. 5B, in a state (i) where the remaining angle is 120 degrees at which the main mirror 33 starts to move, the pulse width is set to 50%, the speed control is performed through the frequency control using the PID calculation amount that is obtained by calculating deviation of the command speed and the detected speed, and the motor is accelerated from the start-up speed to the maximum speed. In a state (ii) where the remaining angle reaches the set value A2 as the deceleration start position, the frequency control unit 103 adds the shift amount to the PID calculation amount to control the frequency while the pulse width of the driving voltage is fixed to 50%. The speed control is performed through such control and the driving speed is decreased toward the end "b" (iii).

From here on out, control of each of the frequency control unit 103, the voltage control unit 104, the phase difference control unit 105 is described with reference to FIGS. 6A to 6D. FIGS. 6A to 6D are timing charts in the case where the control apparatus 21 drives the vibratory actuator 23. In FIG. 6A, a horizontal axis indicates the time, and a vertical axis indicates the rotation angle. In FIG. 6B, a horizontal axis indicates the time, and a vertical axis indicates the pulse width. In FIG. 6C, a horizontal axis indicates the time, and a vertical axis indicates the frequency. In FIG. 6D, a horizontal axis indicates the time, and a vertical axis indicates the speed.

The vibratory actuator 23, driving of which has been started at time t0, is first subjected t0, in the acceleration range 131, the first step (S1) in which the acceleration is performed through the frequency control using the PID calculation amount that is obtained by calculating the deviation of the commanded speed and the detected speed. More specifically, the motor detection speed is controlled by the control apparatus 21 so as to follow the commanded speed, and the frequency control unit 103 uses the PID calculation amount to change the frequency to a low frequency while the pulse width is maintained at 50%. As a result, the main mirror 33 is rotationally moved toward the end "b". The main mirror 33 is accelerated up to 2000 rpm when the frequency is controlled to the low frequency.

When the main mirror is rotationally moved toward the end "b", it is detected at time t1 that the rotation angle of the motor is 40 degrees. In the maximum speed range (132) from the time t1 to time t2, the command speed is substantially fixed to 2000 rpm, and the speed is controlled through the frequency control using the PID calculation amount, which is continuation from the first step (S1).

Thereafter, when it is detected at the time t2 that the rotation angle is 90 degrees, namely, the remaining angle is 30 degrees, the control apparatus 21 performs the second step (S2) of shifting the driving frequency to a high frequency while the driving voltage is fixed. Thus, the deceleration operation is started. Thereafter, the command speed is reduced according to the remaining angle, and the speed control of the third step (S3) is performed. In the second step (S2), the frequency control unit 103 adds the shift amount to the PID calculation amount to control the frequency while the pulse width is fixed to 50%. As a result, the driving frequency is drastically changed to high-frequency side at the time t2. In the deceleration range (133), the frequency control unit 103 adds the shift amount to the PID calculation amount to control the frequency so as to return the frequency to the start-up frequency f0 (71.5 kHz) again as the remaining angle is reduced, while the pulse width is fixed to 50%. Large braking force is obtainable at the time t2, and the driving force that prevents the mirror from being stopped during movement to the target position, is obtainable through control after the time t2.

At time t3, the rotation angle reaches 120 degrees, and command speed becomes 0 rpm. Therefore, the control apparatus 21 performs stop settling control of the vibratory actuator 23. In the stop settling control according to the present embodiment, the control apparatus 21 causes the vibratory actuator 23 to generate the driving force that presses the mirror against the end "b", and the mirror accordingly presses the second contact member 37b disposed at the end "b". During the settling, the frequency control unit 103 controls the driving frequency near the start-up frequency f0. As described above, by controlling the mirror such that the end "b" presses the second contact member 33, the period for reducing the vibration arising due to collision of the mirror and the second contact member 33 can be shortened.

After that, when the positional fluctuation of the main mirror 33 caused by the vibration is eliminated at time t4, the voltage control unit 104 changes the pulse width to 0%. The driving voltage applied to the vibratory actuator 23 is turned off, and the main mirror 33 is held in a non-energized state at the target position. The period from the time t3 to the time t4 may be optionally determined, or the period may not be provided and the above-described operation of pressing the mirror against the contact member may be avoided.

As described above, through the deceleration operation in the second step (S2) and the third step (S3), it is possible to obtain large braking force owing to addition of the shift amount while securing a following property in the deceleration under the PID control. As a result, it is possible to stably decelerate the main mirror 33 and to accurately stop the main mirror 33 by the second contact member 37b disposed at the end "b", at the time t3, as compared with the conventional configuration. Such a configuration makes it possible to suppress swing-back and bounce caused by impact of collision of the main mirror 33 with the second contact member 37b, and to stop the main mirror 33 with high accuracy. Further, even if vibration occurs on the main mirror 33, it is possible to reduce the time until the vibration is eliminated, as compared with the conventional configuration.

In the present embodiment, the voltage control unit 104 fixes the pulse width to 50% in the second step (S2) and the third step (S3). This is because, in the case of applying the large braking force to decelerate the vibratory actuator 23, if the driving voltage is controlled to vary, it becomes unstable. When the driving voltage is reduced, the driving speed is decreased; however, the driving speed is fluctuated due to drastic change of the state of the frictional contact portion of the vibratory actuator 23, which makes the speed variation unstable. In addition, since the vibratory actuator 23 has a dead zone in a region where the driving voltage is small, the speed fluctuates similarly in a region sharing a border with the dead zone. Accordingly, the driving voltage is fixed within the region where the stable driving force is obtainable, and the pulse width is suitably fixed to at least 20% or higher, more preferably 33% or higher and 50% or lower.

Figure 8:
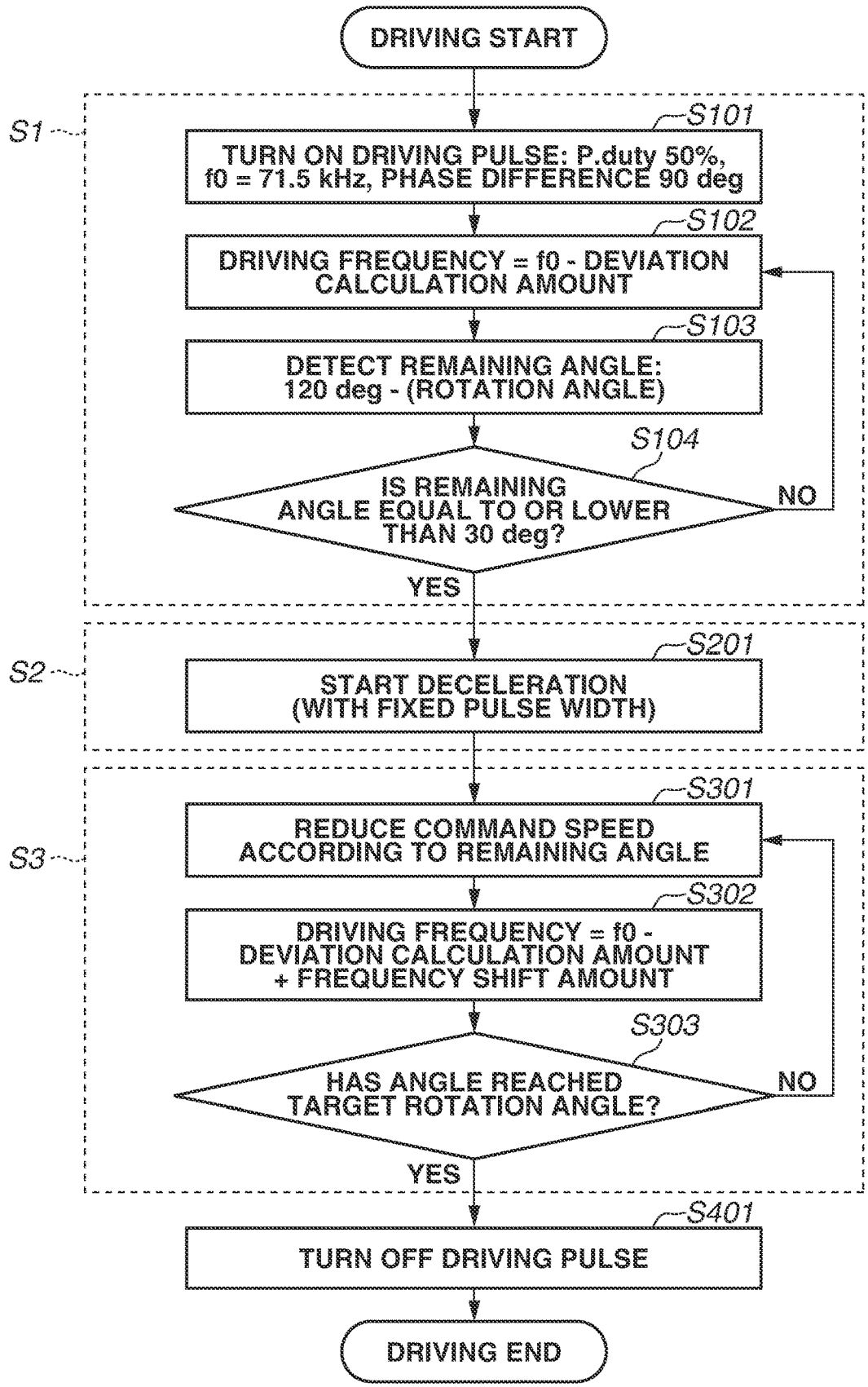
FIG. 8 is a flowchart illustrating a driving method according to the embodiment.

The method of driving the vibratory actuator 23 by the control apparatus 21 is described with reference to FIG. 8. FIG. 8 is a flowchart illustrating an example of the method of driving the vibratory actuator 23 by the control apparatus 21 according to the present embodiment. The control apparatus 21 includes a CPU, a ROM, and a RAM, and processes in the flowchart of FIG. 8 are achieved when the CPU develops programs held by the ROM to the RAM and controls operation of each unit in the control apparatus 21. In FIG. 8, values of the frequency, the voltage (pulse width), the phase difference, the remaining angle, etc. are described; however, these values are only illustrative and non-limiting.

When the control apparatus 21 starts driving of the vibratory actuator 23, the control apparatus 21 performs the first step (S1), the second step (S2), and the third step (S3) in this order.

The first step (S1) is described in detail. First, the target position of the mirror to be driven by the vibratory actuator 23 is set, and the command value including the information of the speed, the voltage, and the driving direction is output from the command unit 110. A start-up initiation value is set to each of the frequency control unit 103, the voltage control unit 104, and the phase difference control unit 105 based on the command value. The drive pulse is turned on, the alternating-current signal is applied from the driving unit 140 to the vibratory actuator 23, and the driving is then started (step S101). In this case, the pulse width of 50%, the frequency of 71.5 kHz, and the phase difference of +90 degrees are set as the start-up initiation values.

Thereafter, the frequency control unit 103 controls the driving frequency based on the PID calculation amount of the speed deviation such that the motor follows the command speed (step S102). In the present embodiment, the frequency control unit 103 controls, based on the command speed, the frequency such that the motor speed is accelerated and then substantially fixed to 2000 rpm. The position comparison unit 102 uses the target rotation angle and the rotation angle detected by the position detection unit 150, to sequentially detect the remaining angle for each control period (step S103). The control amount determination unit 120 compares the remaining angle and the deceleration start angle (step S104). In a case where the remaining angle is larger than 30 degrees (No in step S104), the frequency control at step S102 is continued. In a case where the remaining angle becomes equal to or lower than 30 degrees (Yes in step S104), the control apparatus 21 performs the second step (S2). In this example, the deceleration operation is started at the remaining angle of 30 degrees; however, the deceleration start angle is not limited thereto and may be appropriately set.

In the second step (S2), the deceleration operation is first started while the pulse width is fixed to 50% (step S201). The frequency control unit 103 outputs, as the driving frequency, the PID calculation amount with the shift amount added (step S202). As a result, the braking force to the vibratory actuator 23 is drastically enhanced while the driving voltage is fixed. Therefore, variation of the driving speed in the subsequent deceleration control is more stable than the conventional method.

In the third step (S3), the control is performed such that the command unit 110 changes the command speed according to the remaining angle sequentially detected by the position comparison unit 102 for each control period (step S301). Then, the frequency control unit 103 outputs, as the driving frequency, the PID calculation amount with the shift amount added, to perform the deceleration operation (step S302). Thus, it is possible to perform the stable deceleration control through the PID control that is stabilized owing to the fixed driving voltage while drastically enhancing the braking force to the vibratory actuator 23.

Subsequently, the relative position acquisition unit 109 detects the rotation angle, and it is determined whether the rotation angle is equal to or larger than the target rotation angle (step S303). In a case where it is determined in step S303 that the rotation angle is equal to or larger than the target rotation angle (Yes in step S303), the alternating-current signal of the driving unit 140 is turned off (step S401). In other words, the control unit 21 determines that the mirror has reached the target position and stops the driving of the vibratory actuator 23. At this time, even if the applied voltage is zero, torque occurs owing to the friction force in the vibratory actuator 23, and holding torque is applied to the main mirror 33 as the driven object. Accordingly, it is possible to maintain the main mirror 33 at the stop position even if the actuator is not driven, which allows for reduction of power consumption. In a case where it is determined in step S303 that the rotation angle has not reached the target rotation angle (No in step S303), the processing returns to step S301.

Figure 9A:
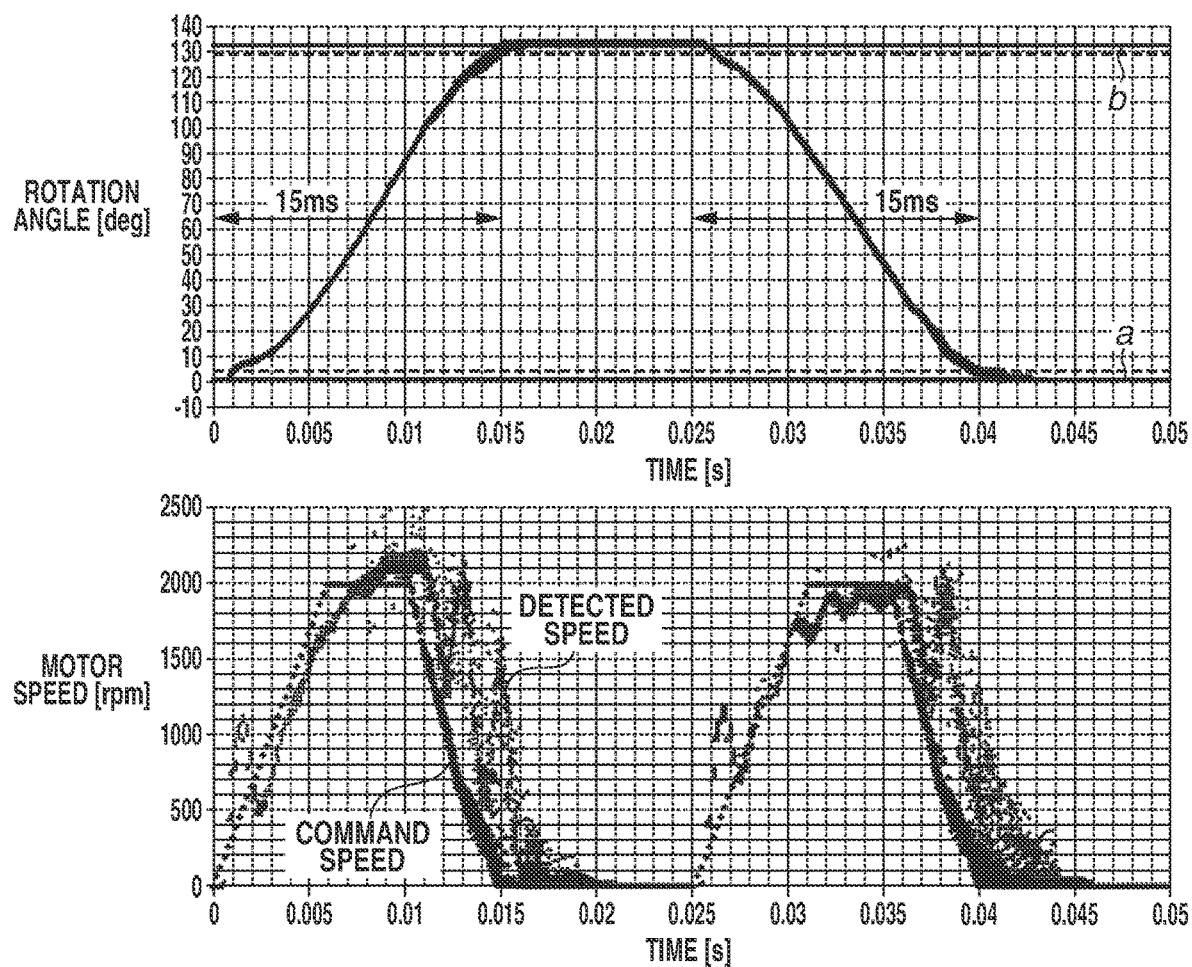

The effects achieved by the present embodiment are described with reference to FIGS. 9A and 9B. FIG. 9B is a diagram illustrating temporal variation of the rotation angle and the speed in the case where the vibratory actuator 23 is driven by the control apparatus 21 according to the present embodiment, to reciprocate the main mirror 33 between the end "a" and the end "b". The rotation angle and the speed of reciprocation of 50 times are overlapped in illustration.

For comparison, FIG. 9A illustrates the rotation angle and the speed in a case where the vibratory actuator is driven by the conventional control apparatus to reciprocate the main mirror.

Figure 7A:
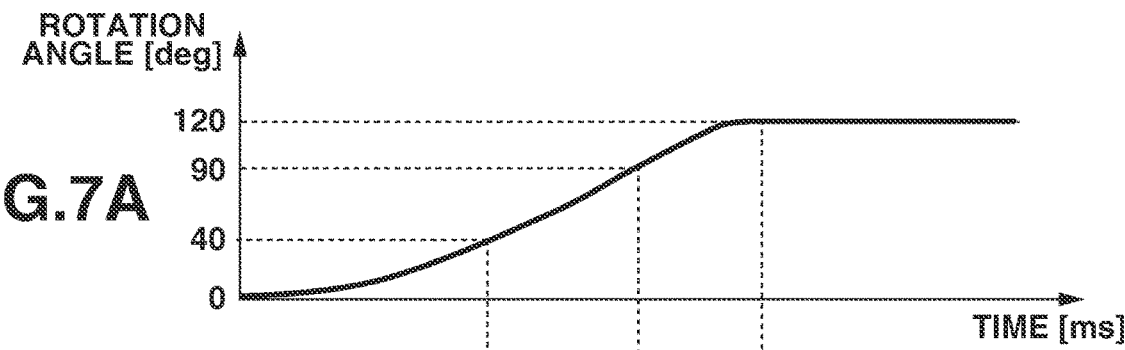
FIGS. 7A to 7D are timing charts in a case where a conventional control apparatus drives a vibratory actuator.
Figure 7B:
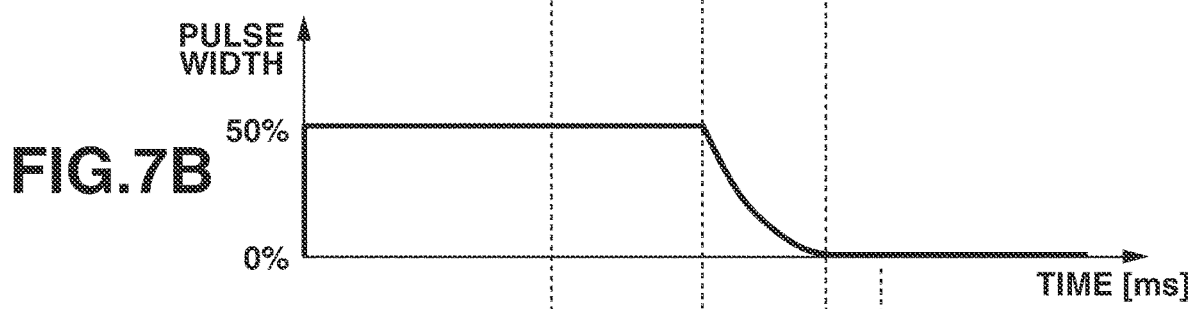
Figure 7C:
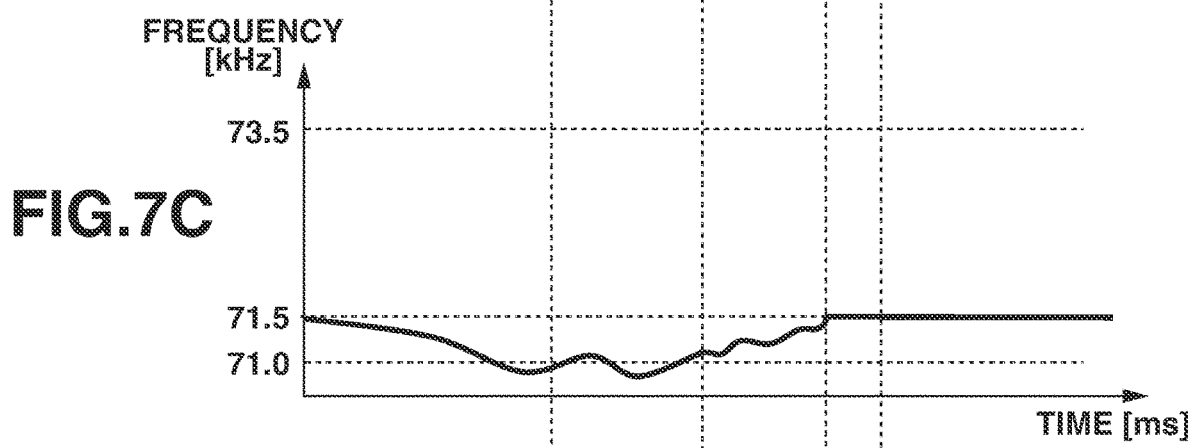
Figure 7D:
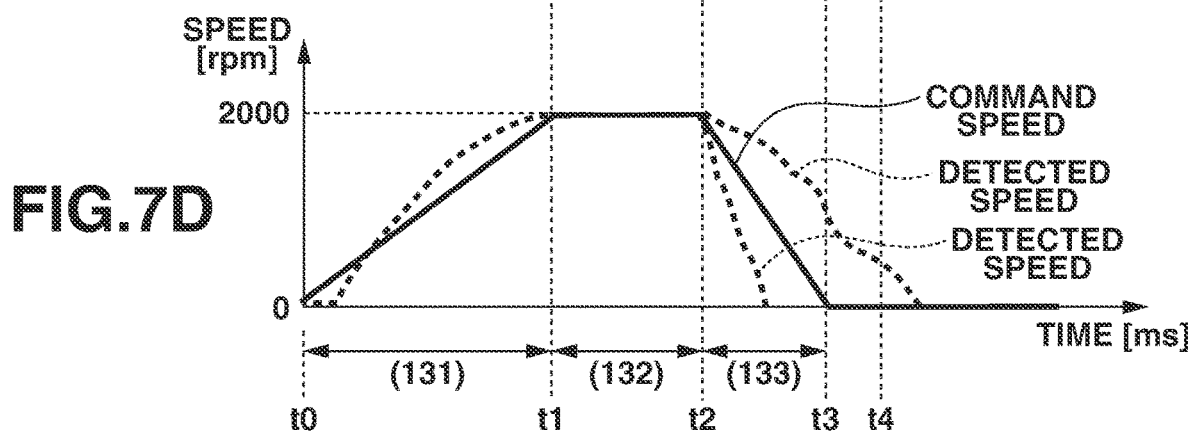

The method of driving the vibratory actuator by the conventional control apparatus is described with reference to FIGS. 7A to 7D. FIGS. 7A to 7D are timing charts in the case where the vibratory actuator is driven by the conventional control apparatus. As an example, in this case, the main mirror 33 is rotated by the rotation angle 120 degrees from the end "a" to the end "b" and is then stopped. FIG. 7A is a timing chart in which a horizontal axis indicates the time and a vertical axis indicates the rotation angle. FIG. 7B is a timing chart in which a horizontal axis indicates the time and a vertical axis indicates the pulse width. FIG. 7C is a timing chart in which a horizontal axis indicates the time and a vertical axis indicates the frequency. FIG. 7D is a timing chart in which a horizontal axis indicates the time and a vertical axis indicates the speed.

The conventional driving apparatus starts driving of the vibratory actuator at time t0, and controls the speed of the motor by controlling the frequency at the pulse width of 50% during a period from the time t0 to time t2. Thereafter, the conventional driving apparatus detects that the rotation angle of the motor is 90 degrees, namely, the remaining angle is 30 degrees at the time t2, and reduces the pulse width of the driving voltage according to the remaining angle to perform the deceleration operation. At this time, the conventional driving apparatus controls the vibratory actuator to stop the mirror to be driven at the target position at time t3.

It is found from FIG. 9A and FIG. 9B that the main mirror 33 reaches from the end "a" to the end "b", or from the end "b" to the end "a" after 15 millisecond (ms) to 20 ms have passed from the driving start in both cases.

FIG. 9A illustrates the result in the case where the conventional driving apparatus is used. In this case, the detected speed in the deceleration is different for each measurement and variation thereof is large. In other words, the variation of the driving speed is unstable. This may be because the driving voltage is reduced in a short time and the braking force is applied to perform deceleration, and therefore the state of the frictional contact portion is drastically changed so that the driving speed is likely to vary. When the speed variation in the deceleration is so large as described above, the driving period until the main mirror 33 reaches the end part is varied and driving sound at collision with the contact member is varied.

In addition, since the vibratory actuator includes the dead zone in the region where the driving voltage is small, the speed control through the voltage control using the PID calculation amount may be sufficiently performed in some cases. As a result, as illustrated by a dashed line in FIG. 7D, the motor speed may be excessively decreased and the main mirror may be accordingly stopped before the target position, or the deceleration may not be sufficiently performed and the main mirror may collide with the contact member at the end part at high speed.

In contrast, in FIG. 9B, the variation of the driving speed during the deceleration is suppressed as compared with FIG. 9A, and variation of the driving time until the main mirror 33 reaches the end part is smaller compared with the conventional driving apparatus. Accordingly, it is possible to stably make a transition to next mirror rotation operation, which contributes to refinement of continuous shooting performance of the camera.

Therefore, the control apparatus 21 according to the present embodiment makes it possible to reduce the variation of the driving speed, which stabilizes the deceleration operation as compared with the conventional control apparatus while moving the driven object at high speed. As a result, using the driving apparatus 20 including the control apparatus 21 according to the present embodiment makes it possible to stop the driven object at the sought position with high accuracy at high speed as compared with the conventional driving apparatus.

The embodiment has been described above; however, the present disclosure is not limited to the embodiment and various modifications and alternations may be made within the scope of the present disclosure.

For example, in the above-described embodiment, the rod-shaped vibratory actuator is used as the vibratory actuator; however, the control apparatus 21 and the control method for the control apparatus 21 are applicable to other vibratory actuators (ultrasonic motors). As illustrated in FIG. 10B, examples of such vibratory actuators include an ultrasonic motor discussed in Japanese Patent Application Laid-Open No. 5-211785. The ultrasonic motor includes no output shaft and performs output to the outside through a gear 17. Other than the above, the control apparatus 21 and the control method for the control apparatus 21 are applicable to, for example, a linear driving ultrasonic motor and an annular ultrasonic motor.

Moreover, in the above-described embodiment, the frequency is output with use of the shift amount in the deceleration control. The frequency set at the deceleration start position, however, may be a preset value. Furthermore, with respect to the control performed after the frequency is shifted to a high frequency at the deceleration start position, either the shift amount may be changed or may not be changed, or the frequency set at the deceleration start position may be maintained.

According to the driving apparatus as one aspect of the present disclosure, it is possible to reduce driving speed in the deceleration control as compared with the conventional driving apparatus.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of Japanese Patent Application No. 2017-094995, filed May 11, 2017, which is hereby incorporated by reference herein in its entirety.

What is claimed is:

1. A control apparatus to control driving a vibratory actuator, wherein the vibratory actuator includes a vibrator provided with an electromechanical energy conversion device, for
    applying a signal to the electromechanical energy conversion device to excite vibration on the vibrator and cause the vibrator and a driven body contacting the vibrator to move relative to one another by the vibration,
    wherein, in a case where the vibratory actuator decelerates, the control apparatus performs operations including:
    changing a driving frequency of the signal to a frequency higher than a start-up frequency of the vibratory actuator and a preceding frequency at a deceleration start position, and, after changing the driving frequency,
    controlling the driving frequency to perform deceleration control, and
    fixing a voltage of the signal in a deceleration period in which the vibratory actuator is decelerated.

2. The control apparatus according to claim 1, wherein the driving frequency becomes a maximum at the deceleration start position.

3. The control apparatus according to claim 1, wherein a difference between the preceding frequency and the frequency higher than the start-up frequency changed at the deceleration start position is larger than a difference between the preceding frequency and the start-up frequency.

4. The control apparatus according to claim 1, wherein the frequency higher than the start-up frequency changed at the deceleration start position is equal to or lower than a maximum frequency at which the vibratory actuator generates driving force sufficient to move an object to be driven.

5. The control apparatus according to claim 1, wherein, in the case where the vibratory actuator decelerates, the voltage of the signal is placed at a level where the vibratory actuator generates driving force sufficient to move an object to be driven and having a value within a range of the driving frequency controlled by the control apparatus.

6. The control apparatus according to claim 1, wherein, in the case where the vibratory actuator decelerates, a pulse width of the voltage of the signal is 20% or higher.

7. The control apparatus according to claim 1, wherein, in the case where the vibratory actuator decelerates, a pulse width of the voltage of the signal is 33% or higher and 50% or lower.

8. The control apparatus according to claim 1, wherein, the control apparatus performs operations further including acquiring relative positions of the vibrator and the driven body.

9. The control apparatus according to claim 1, wherein, the control apparatus performs operations further including:
    acquiring a relative speed of the vibrator and the driven body, and
    controlling the driving frequency based on deviation of the relative speed and command speed.

10. The control apparatus according to claim 9, wherein, in the case where the vibratory actuator decelerates, the control apparatus controls the driving frequency based on the deviation and a frequency shift amount while the voltage of the signal is fixed.

11. The control apparatus according to claim 10, wherein the frequency shift amount is decreased according to a difference between a target stop position and a relative position of the vibrator and the driven body.

12. The control apparatus according to claim 10, wherein the control apparatus includes a deviation calculation device configured to output a deviation calculation amount with use of the deviation, a shift amount controller configured to control the frequency shift amount, and a conversion device configured to add the deviation calculation amount and the frequency shift amount to output the driving frequency.

13. The control apparatus according to claim 9, wherein in the case where the vibratory actuator decelerates, the command speed is decreased according to a difference between a target stop position and a relative position of the vibrator and the driven body.

14. The control apparatus according to claim 1, wherein, in a case of rotating a driven object by the vibratory actuator, the control apparatus starts the deceleration control when a remaining angle up to a point where the driven object reaches an end of a moving range of the driven object is equal to or lower than a set value.

15. The control apparatus according to claim 1, wherein, in a case of translating a driven object by the vibratory actuator, the control apparatus starts the deceleration control when a remaining distance up to a point where the driven object reaches an end of a moving range of the driven object is equal to or lower than a set value.

16. A driving apparatus comprising:
the control apparatus according to claim 1; and
the vibratory actuator configured to be controlled by the control apparatus.

17. The driving apparatus according to claim 16, further comprising a driven object connected to the vibratory actuator.

18. An imaging apparatus comprising: the control apparatus according to claim 1; an imaging device; and
a mirror configured to be movable between a position where the mirror enters an imaging optical axis and a position where the mirror is retracted from the imaging optical axis,
wherein the vibratory actuator is configured to be controlled by the control apparatus to generate driving force to rotate the mirror.

19. The imaging apparatus according to claim 18, further comprising a sensor configured to detect a detected position of the mirror.

20. A method for a control apparatus to control driving a vibratory actuator, wherein the vibratory actuator includes a vibrator provided with an electromechanical energy conversion device, the method comprising:
applying a signal to the electromechanical energy conversion device to excite vibration on the vibrator and cause the vibrator and a driven body contacting the vibrator to move relative to one another by the vibration; and
wherein, in a case where the vibratory actuator decelerates,
changing a driving frequency of the signal to a frequency higher than a start-up frequency of the vibratory actuator and a preceding frequency at a deceleration start position, and, after changing the driving frequency,
controlling the driving frequency to perform deceleration control, and
fixing a voltage of the signal in a deceleration period in which the vibratory actuator is decelerated.

21. The control apparatus according to claim 1, wherein the driving frequency becomes a maximum at the deceleration start position in a process from start-up and acceleration to deceleration.

22. The control apparatus according to claim 1, wherein, in a case where the control apparatus changes the driving frequency, changing the driving frequency from the preceding frequency lower than the start-up frequency to the frequency higher than the start-up frequency.

23. The control apparatus according to claim 1,
wherein the driving frequency is a frequency of an alternating-current signal when driving the vibratory actuator, and
wherein the start-up frequency is the driving frequency when the vibratory actuator is started.

24. The control apparatus according to claim 10,
wherein the frequency shift amount shifts the driving frequency when it is controlled only by a deviation among the deviation of the relative speed and command speed and a difference, and
wherein the difference is a difference between a target stop position and a relative position of the vibrator and the driven body.

25. The method according to claim 20, wherein changing the driving frequency includes changing a driving frequency from the preceding frequency lower than the start-up frequency to the frequency higher than the start-up frequency.

26. The method according to claim 20,
wherein the driving frequency is a frequency of an alternating-current signal when driving the vibratory actuator, and
wherein the start-up frequency is the driving frequency when the vibratory actuator is started.

* * * * *